US010658355B2

(12) United States Patent
Usami

(10) Patent No.: US 10,658,355 B2
(45) Date of Patent: *May 19, 2020

(54) SEMICONDUCTOR INTEGRATED CIRCUIT DEVICE

(71) Applicant: SOCIONEXT INC., Kanagawa (JP)

(72) Inventor: Shiro Usami, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/565,380

(22) Filed: Sep. 9, 2019

(65) Prior Publication Data

US 2020/0006321 A1 Jan. 2, 2020

Related U.S. Application Data

(63) Continuation of application No. 16/122,666, filed on Sep. 5, 2018, now Pat. No. 10,446,540, which is a (Continued)

(30) Foreign Application Priority Data

Sep. 16, 2011 (JP) .................. 2011-202824

(51) Int. Cl.
*H01L 23/52* (2006.01)
*H01L 27/02* (2006.01)
(Continued)

(52) U.S. Cl.
CPC ........ *H01L 27/0292* (2013.01); *H01L 23/528* (2013.01); *H01L 23/5286* (2013.01);
(Continued)

(58) Field of Classification Search
CPC ............. H01L 27/0288; H01L 27/0266; H01L 27/0259; H01L 27/0248; H01L 27/0262
See application file for complete search history.

(56) References Cited

U.S. PATENT DOCUMENTS

| 4,380,021 A | 4/1983 | Matsuyama et al. |
| 5,191,401 A | 3/1993 | Shirai et al. |

(Continued)

FOREIGN PATENT DOCUMENTS

| JP | 03-124056 A | 5/1991 |
| JP | 05-175426 A | 7/1993 |

(Continued)

OTHER PUBLICATIONS

International Search Report issued in International Application No. PCT/JP2012/005583 dated Nov. 6, 2012, with English Translation.
(Continued)

*Primary Examiner* — Nicholas J Tobergte
(74) *Attorney, Agent, or Firm* — McDermott Will & Emery LLP

(57) ABSTRACT

Diffusion regions having the same conductivity type are arranged on a side of a second wiring and a side of a third wiring, respectively under a first wiring connected to a signal terminal. Diffusion regions are separated in a whole part or one part of a range in a Y direction. That is, under first wiring, diffusion regions are only formed in parts opposed to diffusion regions formed under the second wiring and third wiring connected to a power supply terminal or a ground terminal, and a diffusion region is not formed in a central part in an X direction. Therefore, terminal capacity of the signal terminal can be reduced without causing ESD resistance to be reduced, in an ESD protection circuit with the signal terminal.

19 Claims, 16 Drawing Sheets

Related U.S. Application Data continuation of application No. 15/835,340, filed on Dec. 7, 2017, now Pat. No. 10,096,593, which is a continuation of application No. 15/483,372, filed on Apr. 10, 2017, now Pat. No. 9,871,033, which is a continuation of application No. 15/174,236, filed on Jun. 6, 2016, now Pat. No. 9,653,452, which is a continuation of application No. 14/945,378, filed on Nov. 18, 2015, now Pat. No. 9,385,113, which is a continuation of application No. 14/628,175, filed on Feb. 20, 2015, now Pat. No. 9,224,725, which is a continuation of application No. 14/205,022, filed on Mar. 11, 2014, now Pat. No. 8,994,111, which is a continuation of application No. PCT/JP2012/005583, filed on Sep. 4, 2012.

(51) Int. Cl.
*H01L 29/87* (2006.01)
*H01L 29/861* (2006.01)
*H01L 23/528* (2006.01)

(52) U.S. Cl.
CPC ...... *H01L 27/0248* (2013.01); *H01L 27/0251* (2013.01); *H01L 27/0255* (2013.01); *H01L 27/0259* (2013.01); *H01L 27/0262* (2013.01); *H01L 27/0266* (2013.01); *H01L 27/0288* (2013.01); *H01L 29/861* (2013.01); *H01L 29/87* (2013.01)

(56) References Cited

U.S. PATENT DOCUMENTS

| | | | |
|---|---|---|---|
| 5,828,107 A | 10/1998 | Narita | |
| 5,889,309 A | 3/1999 | Yu et al. | |
| 5,923,079 A | 7/1999 | Narita | |
| 6,218,704 B1 | 4/2001 | Brown et al. | |
| 6,320,229 B1 | 11/2001 | Uchikoba et al. | |
| 6,414,341 B1 | 7/2002 | Horiguchi | |
| 7,821,096 B2 | 10/2010 | Usami | |
| 8,102,024 B2 | 1/2012 | Usami | |
| 8,722,522 B2 | 5/2014 | Suzuki | |
| 9,224,725 B2 | 12/2015 | Usami | |
| 9,385,113 B2 | 7/2016 | Usami | |
| 9,871,033 B2 | 1/2018 | Usami | |
| 10,446,540 B2 * | 10/2019 | Usami | H01L 23/528 |
| 2002/0113267 A1 | 8/2002 | Brown et al. | |
| 2004/0124473 A1 | 7/2004 | Maloney et al. | |
| 2005/0269642 A1 | 12/2005 | Minami | |
| 2006/0175663 A1 | 8/2006 | Jeon | |
| 2007/0210419 A1 | 9/2007 | Nawate et al. | |
| 2007/0252231 A1 | 11/2007 | Usami | |
| 2011/0001218 A1 | 1/2011 | Usami | |

FOREIGN PATENT DOCUMENTS

| | | |
|---|---|---|
| JP | H08-222703 A | 8/1996 |
| JP | H09-45853 A | 2/1997 |
| JP | 2000-040788 A | 2/2000 |
| JP | 2000-101026 A | 4/2000 |
| JP | 2000-164816 A | 6/2000 |
| JP | 2006-512771 A | 4/2006 |
| JP | 2006-319073 A | 11/2006 |
| JP | 2007-299790 A | 11/2007 |

OTHER PUBLICATIONS

United States Notice of Allowance issued in related U.S. Appl. No. 14/205,022 dated Dec. 5, 2014.
United States Notice of Allowance issued in related U.S. Appl. No. 14/628,175, dated Aug. 18, 2015.
Non-Final Office Action dated Jan. 29, 2016, issued in U.S. Appl. No. 14/945,378.
Notice of Allowance dated Mar. 7, 2016, issued in U.S. Appl. No. 14/945,378.
Non-Final Office Action dated Aug. 22, 2016, issued in U.S. Appl. No. 15/174,236.
Notice of Allowance dated Jan. 10, 2017, issued in U.S. Appl. No. 15/174,236.
Notice of Allowance dated Sep. 7, 2017, issued in U.S. Appl. No. 15/483,372.
Non-Final Office Action issued in U.S. Appl. No. 15/835,340, dated Mar. 8, 2018.
Notice of Allowance issued in U.S. Appl. No. 15/835,340, dated Jun. 5, 2018.
Non-Final Office Action issued in U.S. Appl. No. 16/122,666, dated Apr. 17, 2019.
Notice of Allowance issued in U.S. Appl. No. 16/122,666, dated Jun. 11, 2019.

* cited by examiner

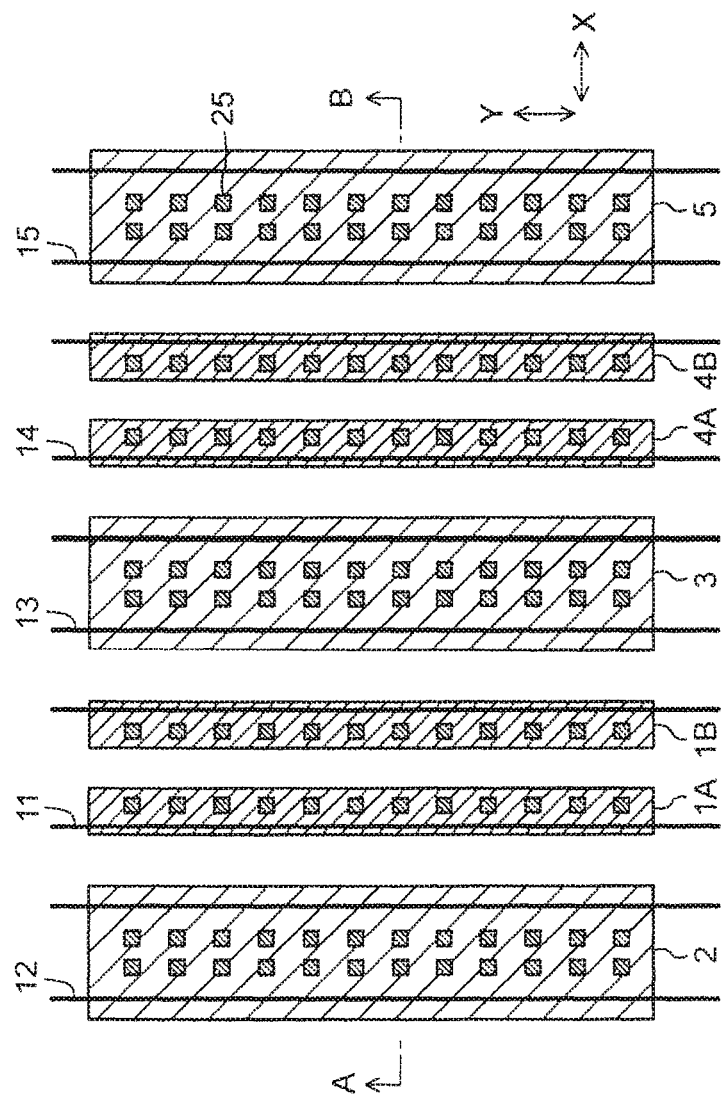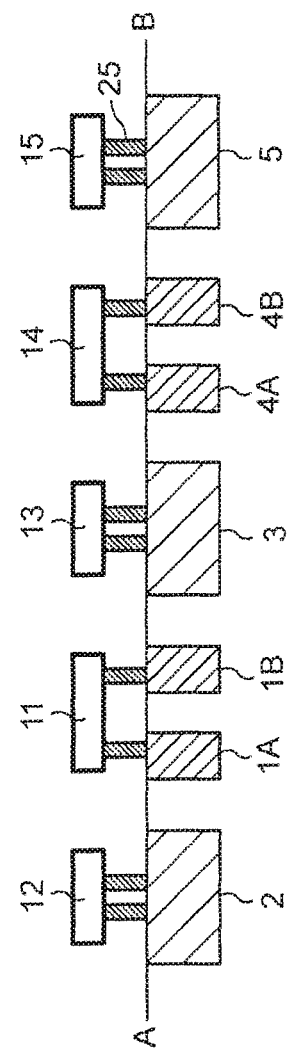
FIG. 6A
FIG. 6B

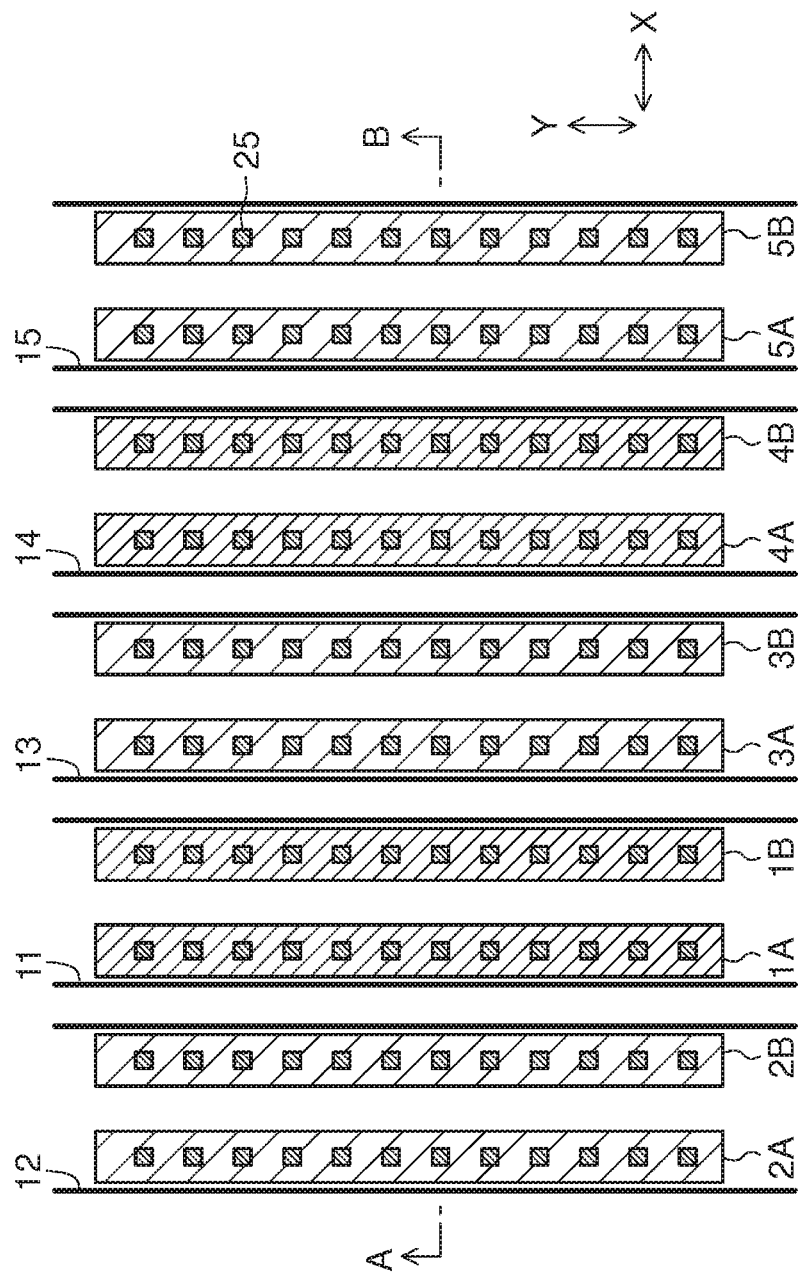
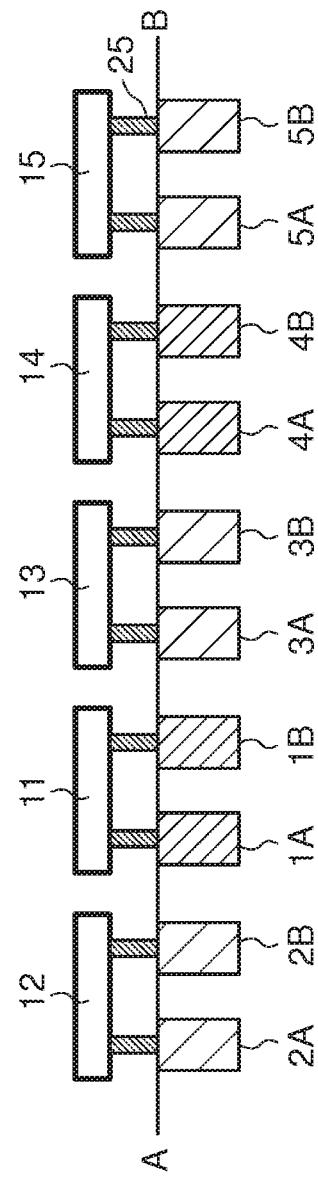
FIG. 7A
FIG. 7B

SEMICONDUCTOR INTEGRATED CIRCUIT DEVICE

This application is a continuation application of U.S. application Ser. No. 16/122,666 filed Sep. 5, 2018, now U.S. Pat. No. 10,446,540, which is a continuation application of U.S. application Ser. No. 15/835,340 filed Dec. 7, 2017, now U.S. Pat. No. 10,096,593, which is a continuation application of U.S. application Ser. No. 15/483,372 filed on Apr. 10, 2017, now U.S. Pat. No. 9,871,033, which is a continuation application of U.S. application Ser. No. 15/174,236 filed on Jun. 6, 2016, now U.S. Pat. No. 9,653,452, which is a continuation of U.S. application Ser. No. 14/945,378 filed on Nov. 18, 2015 now U.S. Pat. No. 9,385,113, which is a continuation of U.S. application Ser. No. 14/628,175 filed on Feb. 20, 2015 now U.S. Pat. No. 9,224,725, which is a continuation of U.S. application Ser. No. 14/205,022 filed on Mar. 11, 2014, now U.S. Pat. No. 8,994,111, which is a continuation of International Application No. PCT/JP2012/005583, with an international filing date of Sep. 4, 2012, which claims priority of Japanese Patent Application No. 2011-202824, filed on Sep. 16, 2011, the contents of each of which are hereby incorporated by reference.

BACKGROUND

1. Technical Field

The present disclosure relates to a semiconductor integrated circuit device and more particularly, to a layout configuration of an ESD (Electro Static Discharge) protection circuit (electrostatic discharge protection circuit) for protecting a circuit from being damaged due to electrostatic discharge.

2. Description of the Related Art

As shown in FIG. 15, in general, ESD protection circuits 51 and 52 are provided between signal terminal (input/output terminal) 53 and power supply terminal 54, and between signal terminal 53 and ground terminal 55, respectively. As the ESD protection circuit, various protection elements are used depending on purposes. Representative ones include a diode, a bipolar transistor, a MOS transistor, a thyristor, and the like.

FIG. 16 shows one example of a layout configuration of a conventional ESD protection circuit. Referring to FIG. 16, diode D serving as the protection element includes diffusion layers 65 as anodes, and diffusion layers 64 as cathodes arranged between them. Each of diffusion layers 64 and 65 is electrically connected to a wiring connected to an input/output terminal or the like, through contact holes 63 (Unexamined Japanese Patent Publication No. 2007-299790, FIG. 16).

SUMMARY

In the case where the above-described ESD protection circuit is provided, capacity between wirings due to the wiring arrangement, and diffusion capacity due to junction of the diffusion layers exist between the signal terminal, and the power supply terminal and the ground terminal. Therefore, as for the signal terminal for inputting/outputting a high-speed signal, its terminal capacity including the capacity between the wirings and the diffusion capacity could cause a signal waveform to deteriorate. Therefore, it is preferable to provide an ESD protection circuit in which the terminal capacity is reduced, in a semiconductor integrated circuit which inputs and outputs the high-speed signal especially.

As a method for reducing the terminal capacity, it is considered that a size of the protection element is reduced to reduce the diffusion capacity. However, in the case where the size of the protection element is simply reduced, the problem that ESD resistance is reduced occurs. In addition, when a wiring width connected to the diffusion layer is reduced, or the number of contacts and the number of via holes are reduced because an area of the diffusion region is reduced, the wiring or the like could be fused by a surge current.

In view of the above problems, it is an object of the present disclosure to reduce terminal capacity of a signal terminal in an ESD protection circuit with the signal terminal without causing ESD resistance to be reduced.

According to one aspect of the present disclosure, an ESD protection circuit in a semiconductor integrated circuit device includes a first wiring extending in a first direction and electrically connected to a first terminal, a second and a third wirings extending in the first direction, electrically connected to a power supply terminal or a ground terminal, and arranged on both sides of the first wiring, respectively, a first and a second diffusion regions formed under the first wiring, having a same first conductivity type, arranged on a side of the second wiring and a side of the third wiring, respectively in a second direction perpendicular to the first direction, and separated in a whole part or one part of a range in the first direction, a third diffusion region formed under the second wiring, having a second conductivity type, and arranged so as to be opposed to the first diffusion region in the second direction, and a fourth diffusion region formed under the third wiring, having the second conductivity type, and arranged so as to be opposed to the second diffusion region in the second direction. Under the first wiring connected to the first terminal, the first and second diffusion regions having the same conductivity type are arranged on the sides of the second wiring and the third wiring, respectively, and the first and second diffusion regions are separated in the whole or one part in the area of the wiring extending in the first direction. That is, under the first wiring, the diffusion region is formed only the parts opposed to the third and fourth diffusion regions formed under the second and third wirings connected to the power supply terminal or the ground terminal, and the diffusion region is not formed in the central part in the second direction perpendicular to the first direction. Therefore, an area of the diffusion region in the protection element can be reduced, so that terminal capacity of the first terminal can be reduced. In addition, in the area opposed to the diffusion region on the side of the power supply terminal or the ground terminal, the diffusion region is not reduced, so that the discharge ability of the protection element is not reduced. Furthermore, a wiring width of the first wiring, and the number of contacts and the number of via holes are sufficiently ensured, so that reduction in discharge ability due to the fusion is not generated.

According to another aspect of the present disclosure, an ESD protection circuit in a semiconductor integrated circuit device includes a first wiring extending in a first direction and electrically connected to a first terminal, a second and a third wirings extending in the first direction, electrically connected to a power supply terminal or a ground terminal, and arranged on both sides of the first wiring, respectively, a first diffusion region formed under the first wiring, and having a first conductivity type, and a second diffusion region formed under the second wiring, having a second conductivity type, and arranged so as to be opposed to the first diffusion region in a second direction perpendicular to the first direction, a third diffusion region formed under the third wiring, having the second conductivity type, and arranged so as to be opposed to the first diffusion region in the second direction, in which in a range including the first diffusion region and the second diffusion region opposed to each other, an interval between the first wiring and the second wiring is larger than an interval between the first diffusion region and the second diffusion region, and in a range including the first diffusion region and the third diffusion region opposed to each other, an interval between the first wiring and the third wiring is larger than an interval between the first diffusion region and the third diffusion region. The first diffusion region formed under the first wiring connected to the first terminal is opposed to the second and third diffusion regions formed under the second and third wirings connected to the power supply terminal or the ground terminal, respectively. Thus, in the range including the diffusion regions opposed to each other, the interval between the wirings is larger than the interval between the diffusion regions. Therefore, capacity between wirings can be reduced, so that terminal capacity of the first terminal can be reduced.

According to the present disclosure, the terminal capacity of the signal terminal can be reduced without impairing the ability as the protection element.

BRIEF DESCRIPTION OF DRAWINGS

FIG. 6A is a view showing another example of the layout configuration according to the first exemplary embodiment;

FIG. 6B is a view showing the other example of the layout configuration according to the first exemplary embodiment;

FIG. 7A is a view showing another example of the layout configuration according to the first exemplary embodiment;

FIG. 7B is a view showing the other example of the layout configuration according to the first exemplary embodiment;

DETAILED DESCRIPTION OF THE PREFERRED EMBODIMENTS

Hereinafter, exemplary embodiments of the present disclosure will be described with reference to drawings.

First Exemplary Embodiment

Figure 1A:
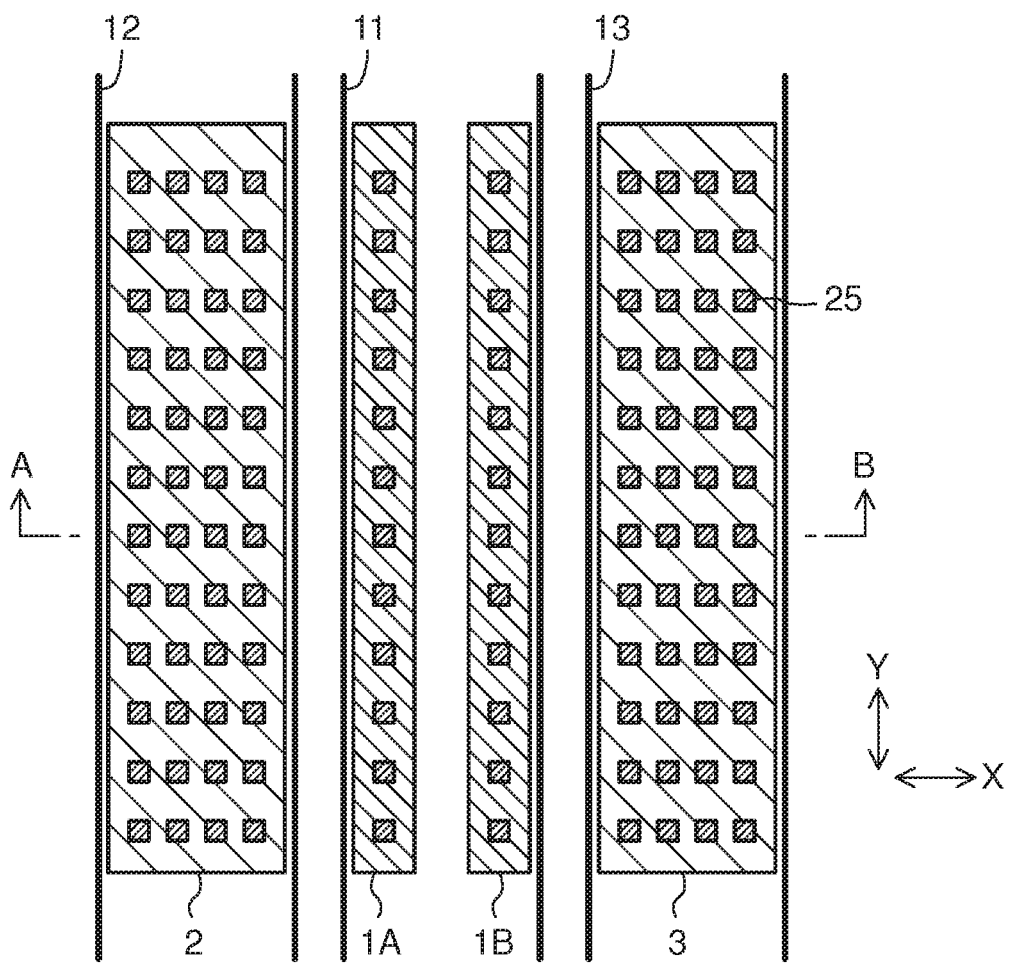
FIG. 1A is a view showing a layout configuration regarding an ESD protection circuit of a semiconductor integrated circuit device according to a first exemplary embodiment.
Figure 1B:
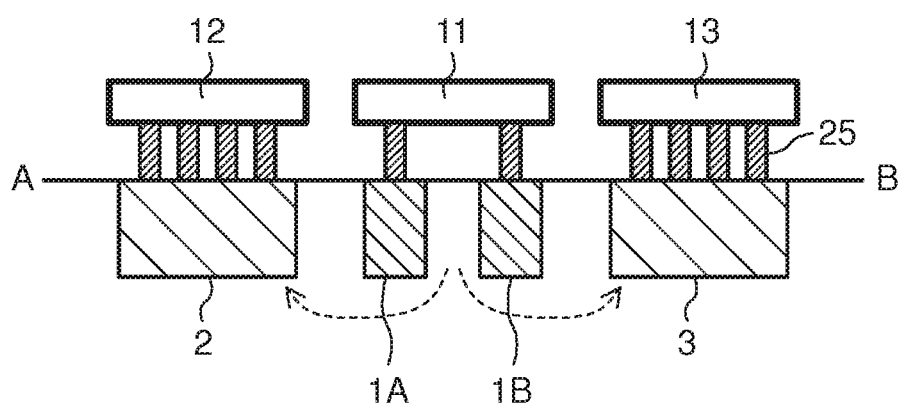
FIG. 1B is a view showing the layout configuration regarding the ESD protection circuit of the semiconductor integrated circuit device according to the first exemplary embodiment.

FIGS. 1A and 1B are views showing a layout configuration regarding an ESD protection circuit of a semiconductor integrated circuit device according to a first exemplary embodiment. FIG. 1A is a plan view taken from above a substrate, and FIG. 1B is a cross-sectional view taken along a line A-B in FIG. 1A.

First wiring 11 extends in a Y direction (first direction) in FIG. 1A, and electrically connected to a signal terminal (first terminal) which is not shown. Second wiring 12 and third wiring 13 extend in the Y direction similarly to first wiring 11, and arranged on both sides of first wiring 11, respectively. Each of second wiring 12 and third wiring 13 is electrically connected to a power supply terminal or a ground terminal which is not shown.

Under first wiring 11, diffusion region 1A serving as a first diffusion region and diffusion region 1B serving as a second diffusion region are formed. Diffusion region 1A and diffusion region 1B are separately arranged on a side of second wiring 12 and a side of third wiring 13, in an X direction (second direction) in FIG. 1A. In other words, first wiring 11 extends so as to cover diffusion regions 1A and 1B. Diffusion regions 1A and 1B have the same conductivity type.

Under second wiring 12, diffusion region 2 is formed as a third diffusion region. Diffusion region 2 is arranged so as to be opposed to diffusion region 1A in the X direction. In addition, under third wiring 13, diffusion region 3 is formed as a fourth diffusion region. Diffusion region 3 is arranged so as to be opposed to diffusion region 1B in the X direction. Diffusion regions 2 and 3 have the same conductivity type.

First wiring 11, and diffusion regions 1A and 1B are electrically connected through contacts 25. Similarly, second wiring 12 and diffusion region 2 are electrically connected through contacts 25, and third wiring 13 and diffusion region 3 are electrically connected through contacts 25. In addition, in FIG. 1A and other plan views, the diffusion region provided under the wiring is shown so as to be seen through to easily understand the configuration.

Here, it is assumed that each of second and third wirings 12 and 13 is electrically connected to the power supply terminal. It is assumed that the ESD protection circuit is a diode type in which the signal terminal (first wiring 11) serves as an anode, and the power supply terminal (second and third wirings 12 and 13) serves as a cathode. In this case, diffusion regions 1A and 1B are a P type, and diffusion regions 2 and 3 are an N type.

According to the configuration in FIG. 1A, diffusion regions 1A and 1B are provided under first wiring 11 on an anode side in such a manner that parts opposed to diffusion regions 2 and 3 on a cathode side are only left, and a central part in the X direction is eliminated. As for the eliminated central part, a transverse distance in a well (N well) is long and resistance is high at the time of discharging as shown by dotted lines in FIG. 1B, so that discharge ability is low, and a function as the protection element is not sufficiently fulfilled. Meanwhile, as for the part opposed to the cathode, a transverse distance in the well is short and resistance is low at the time of discharging. Therefore, according to this exemplary embodiment, as for the diffusion region under the first wiring 11 on the anode side, the part opposed to the cathode side is only left, and the central part is eliminated. As a result, diffusion capacity can be reduced without impairing the function as the protection element. Therefore, terminal capacity of the signal terminal can be reduced. In addition, by ensuring a wiring width, the number of contacts, and the number of via holes to the extent that a surge current can flow, ESD resistance can be prevented from being reduced.

In addition, according to the configuration in FIG. 1A, each of diffusion regions 1A, 1B, 2, and 3 has a vertically long shape, that is, a rectangular shape in which a dimension in the Y direction along which the wiring extends is larger than a dimension in the X direction. In addition, diffusion regions 1A and 1B are smaller in width than diffusion regions 2 and 3, that is, diffusion regions 1A and 1B are smaller in dimension in the X direction than diffusion regions 2 and 3. However, this exemplary embodiment is not limited to this shape.

Figure 2A:
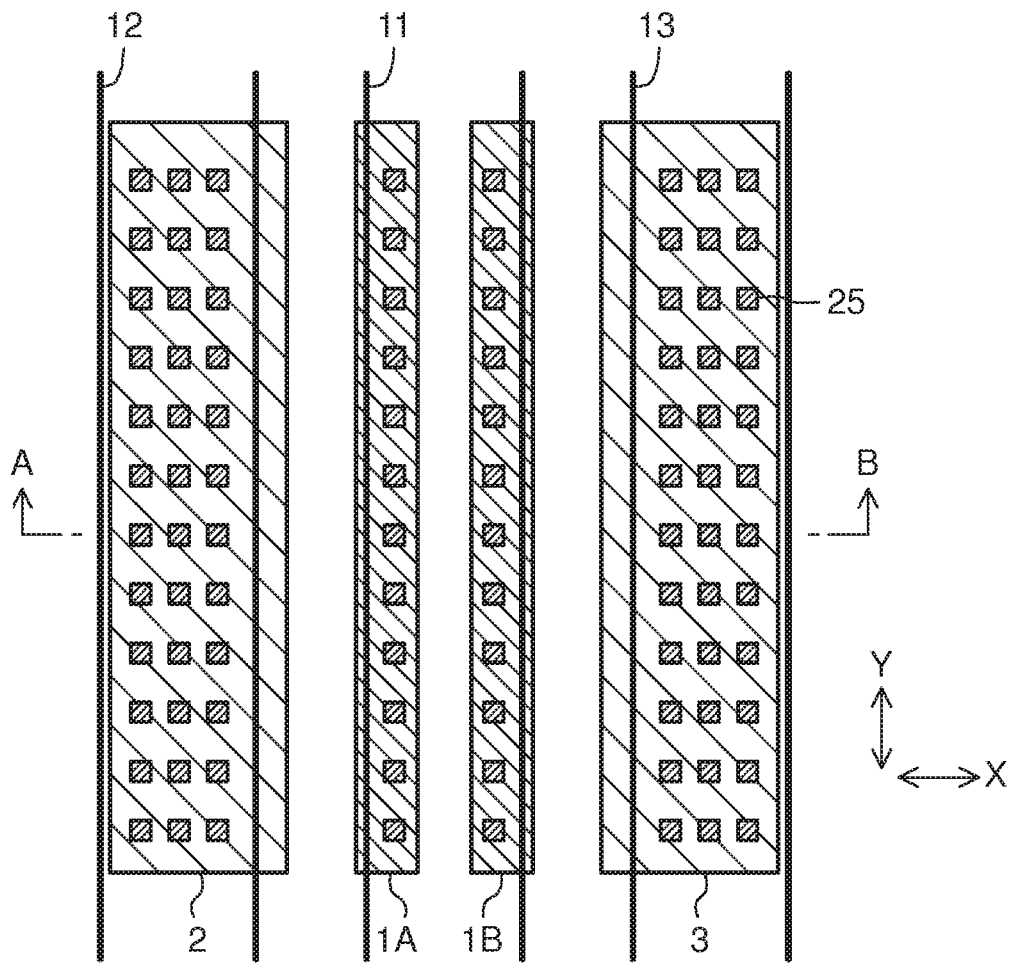
FIG. 2A is a view showing a layout configuration according to a variation of the first exemplary embodiment.
Figure 2B:
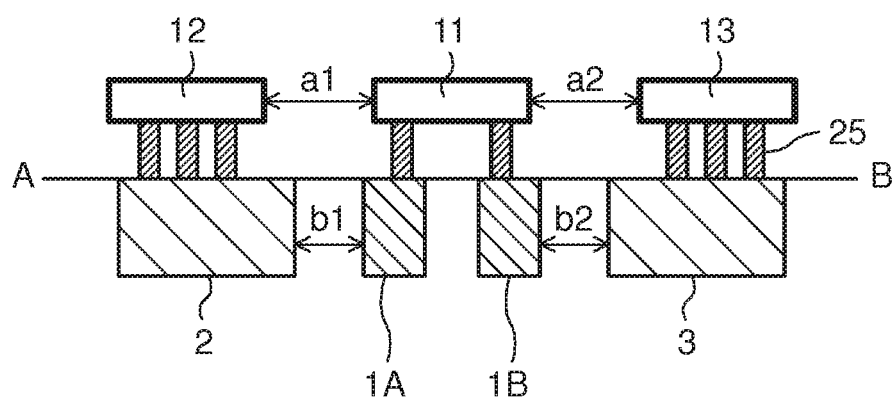
FIG. 2B is a view showing the layout configuration according to the variation of the first exemplary embodiment.

FIGS. 2A and 2B are views showing a first variation of this exemplary embodiment. FIG. 2A is a plan view taken from above a substrate, and FIG. 2B is a cross-sectional view taken along a line A-B in FIG. 2A. In FIGS. 2A and 2B, a component common to that in FIG. 1 is marked with the same reference sign.

A configuration of FIG. 2 is almost the same as that in FIG. 1. However, there is a difference between them in that an interval between wirings is larger than an interval between diffusion regions, in a range including the diffusion regions opposed to each other. Therefore, compared with the configuration in FIG. 1, capacity between wirings is also reduced, and terminal capacity can be further reduced.

More specifically, in the area including diffusion region 1A and diffusion region 2 opposed to each other, interval a1 between first wiring 11 and second wiring 12 is larger than interval b1 between diffusion region 1A and diffusion region 2. According to a layout in FIG. 2, diffusion region 1A protrudes toward a side of diffusion region 2 from first wiring 11, and diffusion region 2 protrudes toward a side of diffusion region 1A from second wiring 12, in planar view. Similarly, in the area including diffusion region 1B and diffusion region 3 opposed to each other, interval a2 between first wiring 11 and third wiring 13 is larger than interval b2 between diffusion region 1B and diffusion region 3. According to the layout in FIG. 2, diffusion region 1B protrudes toward a side of diffusion region 3 from first wiring 11, and diffusion region 3 protrudes toward a side of diffusion region 1B from third wiring 13, in planar view.

According to this configuration, the interval between first wiring 11 and second wiring 12, and the interval between first wiring 11 and third wiring 13 are large, so that the capacity between the wirings is reduced, and the terminal capacity can be further reduced.

Figure 3A:
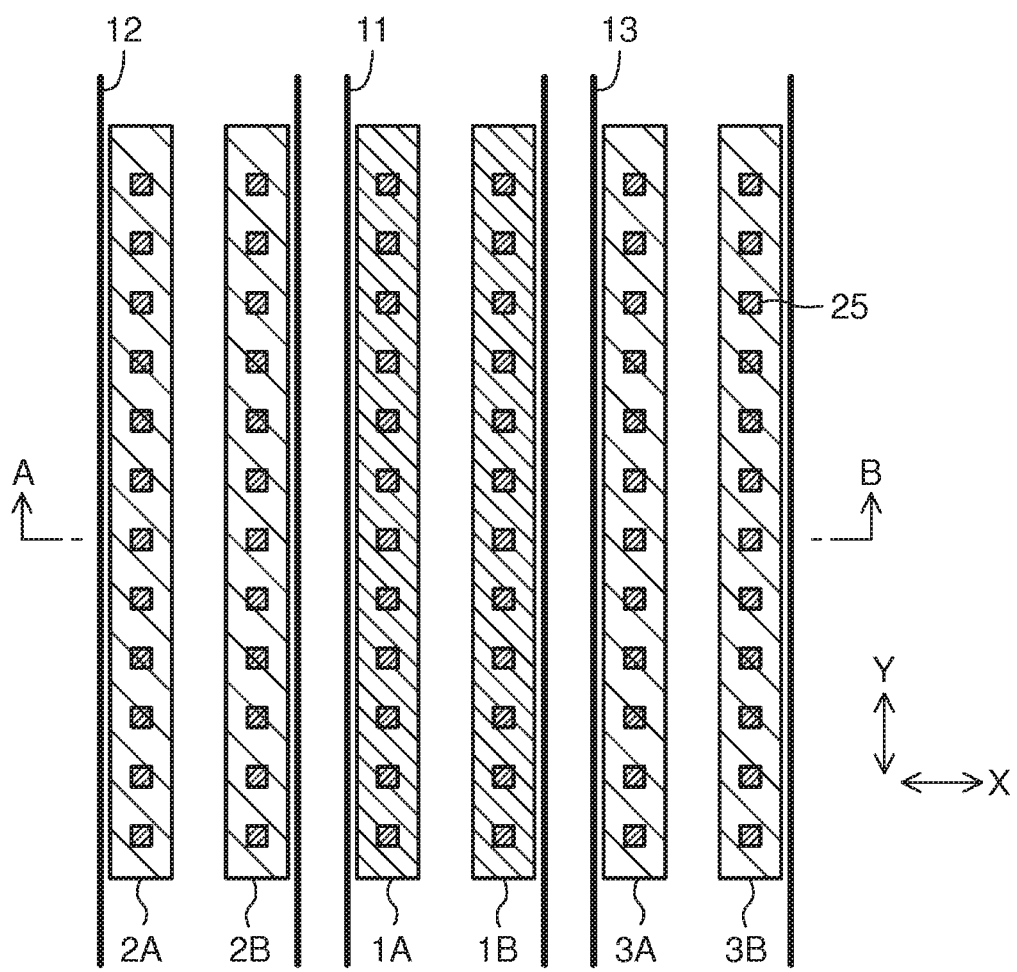
FIG. 3A is a view showing a layout configuration according to a variation of the first exemplary embodiment.
Figure 3B:
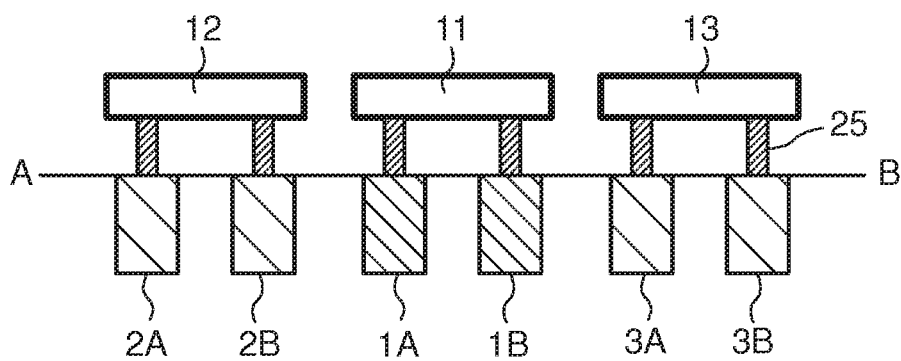
FIG. 3B is a view showing the layout configuration according to the variation of the first exemplary embodiment.

FIGS. 3A and 3B are views showing a second variation in this exemplary embodiment. FIG. 3A is a plan view taken from above a substrate, and FIG. 3B is a cross-sectional view taken along a line A-B in FIG. 3A. In FIG. 3, a component common to that in FIG. 1 is marked with the same reference sign.

A configuration in FIG. 3 is almost the same as that in FIG. 1. However, there is a difference between them in that as for the diffusion regions formed under second wiring 12 and third wiring 13, parts other than parts opposed to the other diffusion regions are eliminated. More specifically, diffusion regions 2A and 2B are formed under second wiring 12 so as to be arranged separately on both sides in the X direction, and diffusion regions 3A and 3B are formed under third wiring 13 so as to be arranged separately on both sides in the X direction. Thus, terminal capacity of a power supply terminal or a ground terminal can be reduced.

Figure 4A:
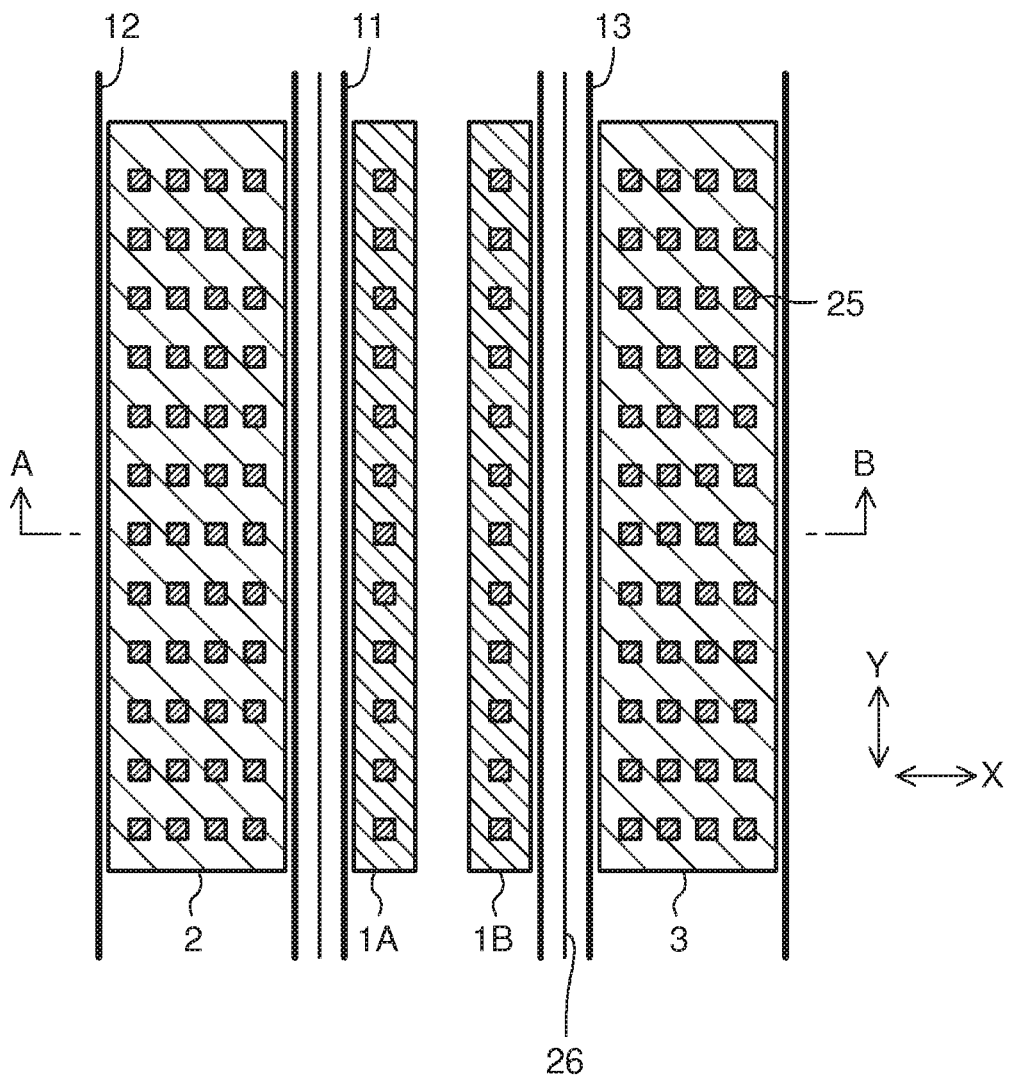
FIG. 4A is a view showing a layout configuration in a case where the ESD protection circuit is a thyristor type in FIG. 1.
Figure 4B:
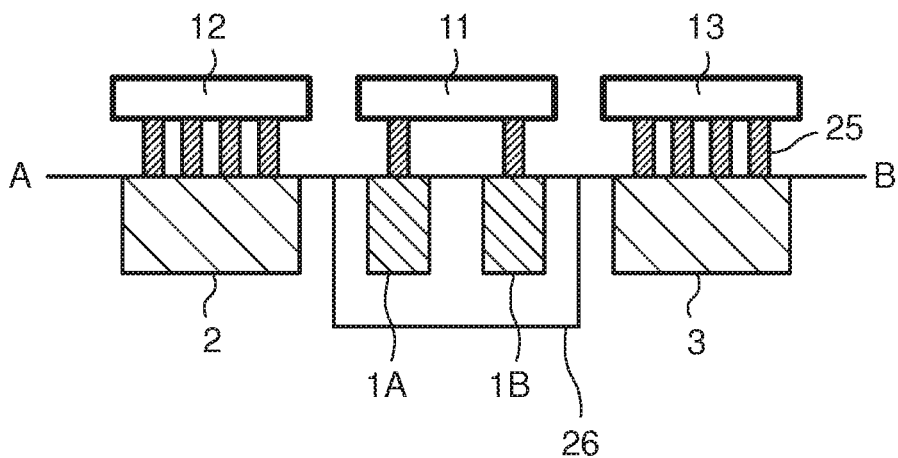
FIG. 4B is a view showing the layout configuration in the case where the ESD protection circuit is a thyristor type in FIG. 1.

In addition, the configuration of this exemplary embodiment is not limited to the diode type ESD protection circuit in which the protection element serves as the diode, and it can be similarly applied to a case where the protection element serves as a bipolar transistor or a thyristor. More specifically, the ESD protection circuit according to this exemplary embodiment may be a bipolar transistor type in which the signal terminal (first wiring 11) serves as a collector, and the power supply terminal (second and third wirings 12 and 13) serves as an emitter. In this case, diffusion regions 1A and 1B are the P type, and diffusion regions 2 and 3 are also the P type. In addition, the ESD protection circuit according to this exemplary embodiment may be a thyristor type in which the signal terminal (first wiring 11) serves as the cathode, and the power supply terminal (second and third wiring 12 and 13) serves as the anode. In this case, as shown in FIG. 4, P-type well 26 is formed, diffusion regions 1A and 1B are the N type, and diffusion regions 2 and 3 are the P type.

In addition, second and third wirings 12 and 13 may be electrically connected to the ground terminal. In this case, the ESD protection circuit according to this exemplary embodiment is a diode type in which the ground terminal (second and third wirings 12 and 13) serves as the anode, and the signal terminal (first wiring 11) serves as the cathode. In this case, diffusion regions 1A and 1B are the N type, and diffusion regions 2 and 3 are the P type. In addition, the ESD protection circuit according to this exemplary embodiment may be a bipolar transistor type in which the ground terminal (second and third wirings 12 and 13) serves as the emitter, and the signal terminal (first wiring 11) serves as the collector. In this case, diffusion regions 1A and 1B are the N type, and diffusion regions 2 and 3 are also the N type. In addition, the ESD protection circuit according to this exemplary embodiment may be a thyristor type in which the ground terminal (second and third wirings 12 and 13) serves as the cathode, and the signal terminal (first wiring 11) serves as the anode. In this case, as shown in FIG. 4, N-type well 26 is formed, diffusion regions 1A and 1B are the P type, and diffusion regions 2 and 3 are the N type.

Figure 5A:
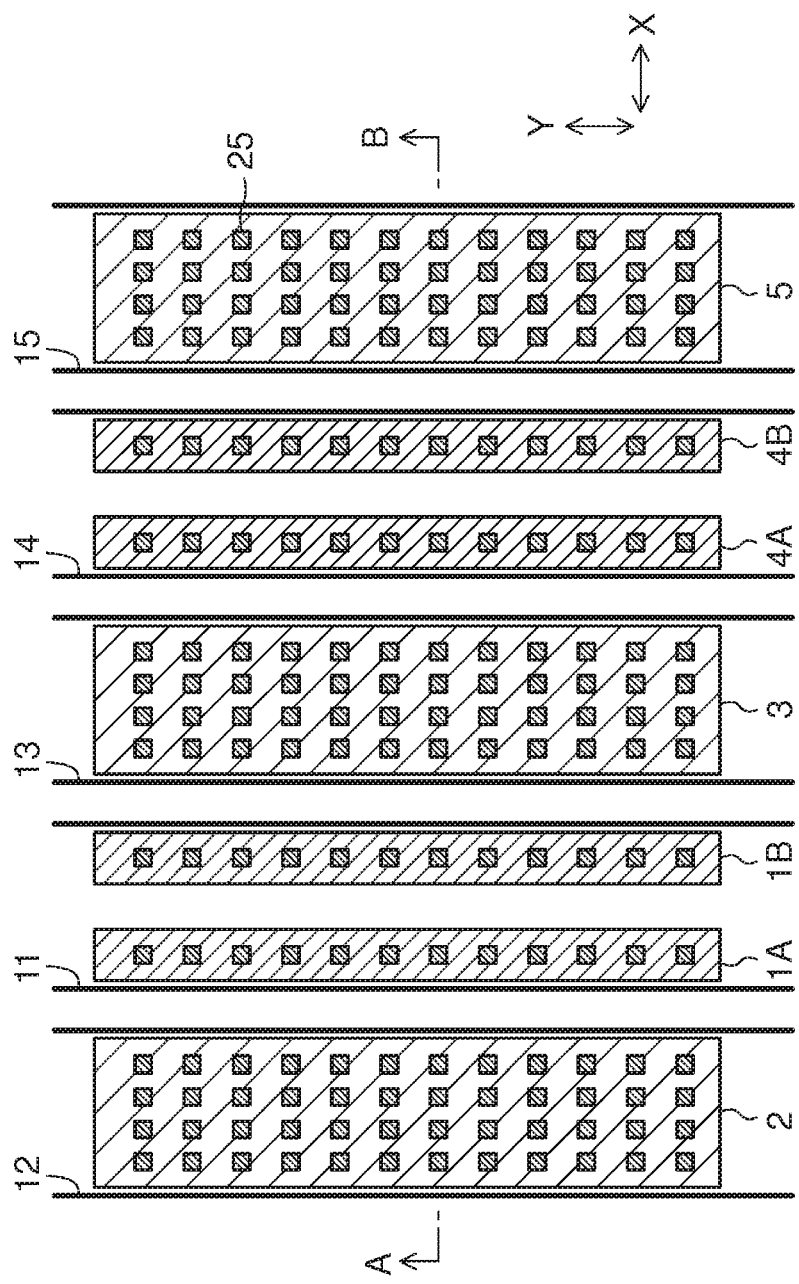
FIG. 5A is a view showing another example of the layout configuration according to the first exemplary embodiment.
Figure 5B:
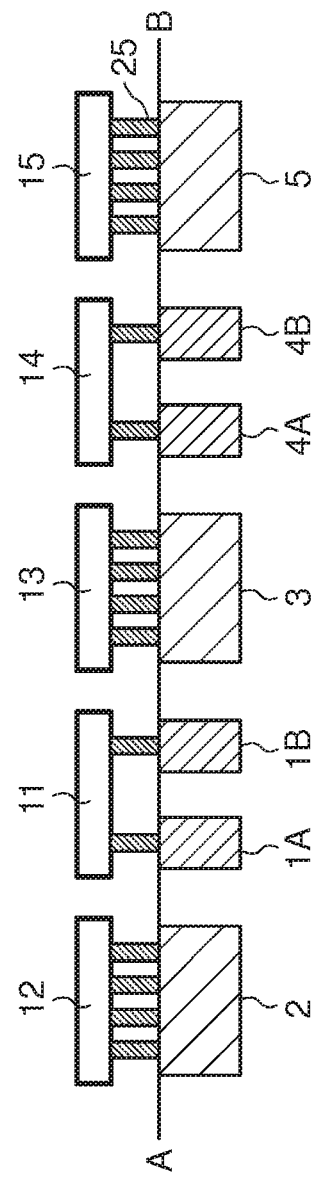
FIG. 5B is a view showing the other example of the layout configuration according to the first exemplary embodiment.

In addition, as shown in FIGS. 5 to 7, the number of parts in which the diffusion region is divided may be further increased. Configurations in FIGS. 5 to 7 correspond to the configurations in FIGS. 1 to 3, respectively. Wiring 14 is electrically connected to a signal terminal, and wiring 15 is electrically connected to a power supply terminal or the ground terminal. Diffusion regions 4A and 4B are formed under wiring 14 so as to be arranged separately in an X direction. In addition, in FIGS. 5 and 6, diffusion region 5 is arranged under wiring 15, and in FIG. 7, diffusion regions 5A and 5B are formed under wiring 15 so as to be arranged separately in the X direction.

In addition, according to the above-described layout configuration, diffusion regions 1A and 1B are separated in a whole range in the Y direction, but the configuration is not limited to this, and for example, a layout configuration may be such that diffusion regions 1A and 1B are partially connected and one part of them is separated. In this configuration also, diffusion capacity can be reduced without impairing the function as the protection element, so that terminal capacity of the signal terminal can be reduced. That is, diffusion regions 1A and 1B may be separated in the whole part or one part of the range in the Y direction.

Second Exemplary Embodiment

Figure 8A:
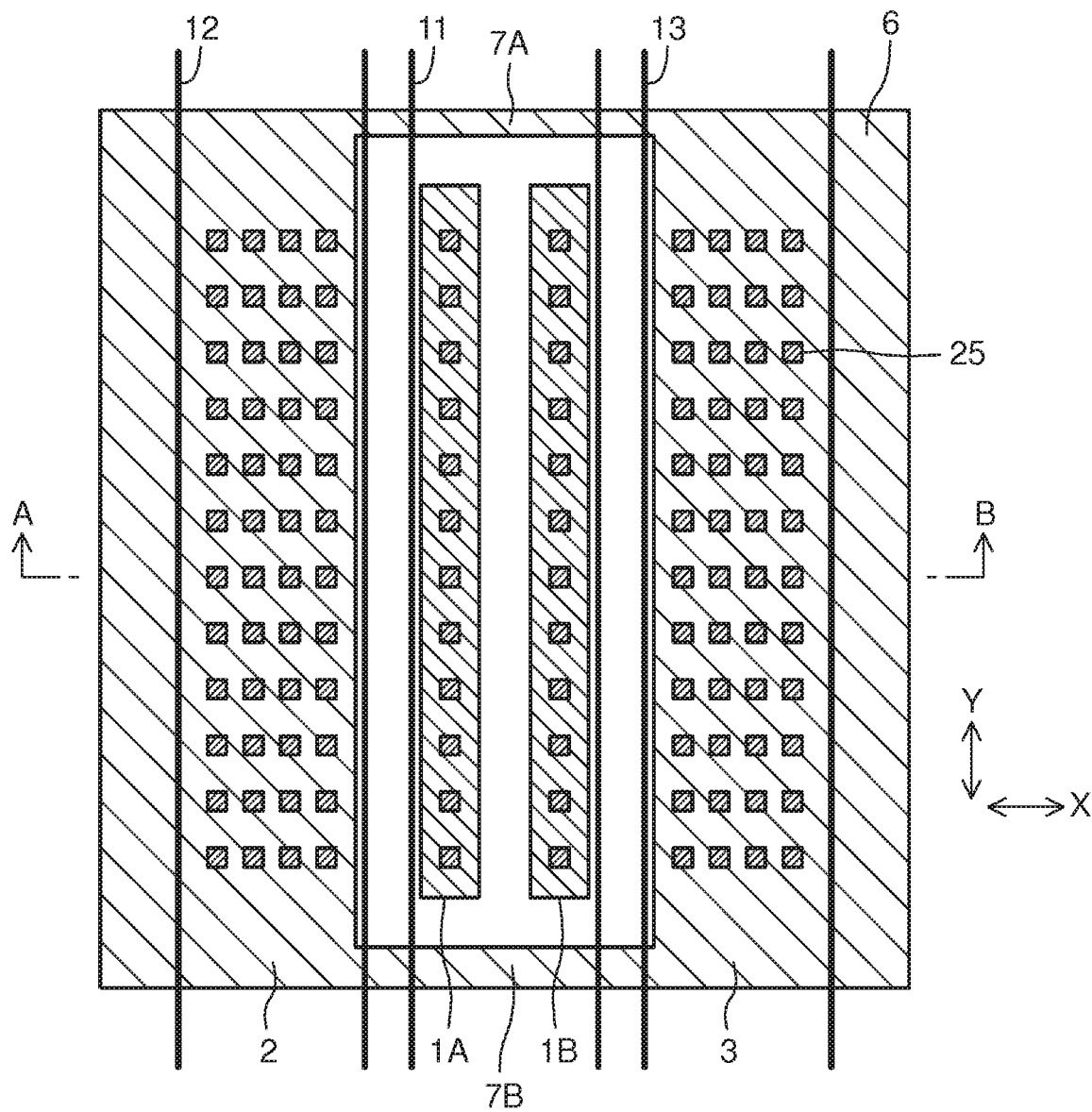
FIG. 8A is a view showing a layout configuration regarding an ESD protection circuit of a semiconductor integrated circuit device according to a second exemplary embodiment.
Figure 8B:
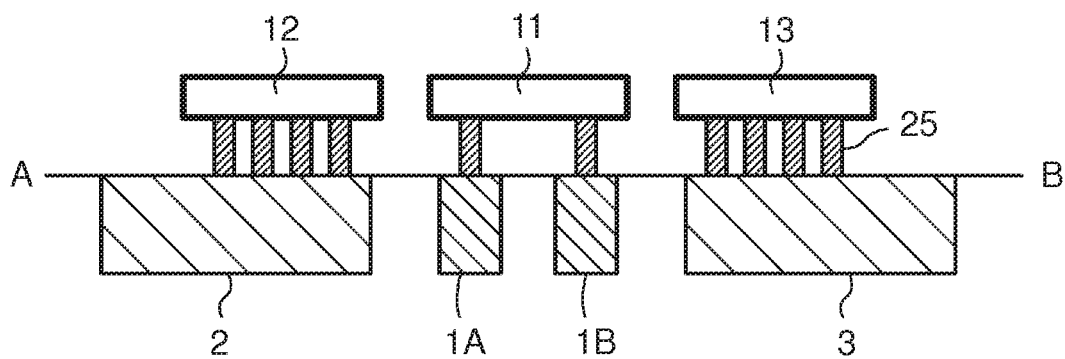
FIG. 8B is a view showing the layout configuration regarding the ESD protection circuit of the semiconductor integrated circuit device according to the second exemplary embodiment.

FIGS. 8A and 8B are views showing a layout configuration regarding an ESD protection circuit of a semiconductor integrated circuit device according to a second exemplary embodiment. FIG. 8A is a plan view taken from above a substrate, and FIG. 8B is a cross-sectional view taken along a line A-B in FIG. 8A.

First wiring 11 extends in a Y direction (first direction) in FIG. 8A, and electrically connected to a signal terminal (first terminal) which is not shown. Second wiring 12 and third wiring 13 extend in the Y direction similarly to first wiring 11, and arranged on both sides of first wiring 11, respectively. Second wiring 12 and third wiring 13 are electrically connected to a power supply terminal or a ground terminal which is not shown.

Under first wiring 11, diffusion region 1A serving as a first diffusion region and diffusion region 1B serving as a second diffusion region are formed. Diffusion region 1A and the diffusion region 1B are separately arranged on a side of second wiring 12 and a side of third wiring 13, in an X direction (second direction) in FIG. 8A. In other words, first wiring 11 extends so as to cover diffusion regions 1A and 1B. Diffusion regions 1A and 1B have the same conductivity type.

Thus, diffusion region 6 is formed so as to surround diffusion regions 1A and 1B. Diffusion region 6 has a shape including diffusion region 2 formed under second wiring 12 and arranged so as to be opposed to diffusion region 1A in the X direction, and diffusion region 3 formed under third wiring 13, and arranged so as to be opposed to diffusion region 1B in the X direction. That is, diffusion regions 2 and 3 are connected to each other through diffusion regions 7A and 7B formed beyond both ends of diffusion regions 1A and 1B in the Y direction, and integrally formed so as to surround diffusion regions 1A and 1B.

First wiring 11, and the diffusion regions 1A and 1B are electrically connected through contacts 25. Similarly, second wiring 12 and diffusion region 2 are electrically connected through contacts 25, and third wiring 13 and diffusion region 3 are electrically connected through contacts 25.

In this exemplary embodiment also, the same effect as the first exemplary embodiment can be obtained. That is, diffusion regions 1A and 1B provided under first wiring 11 have a configuration in which parts opposed to diffusion regions 2 and 3 are only left and a central part in the X direction is eliminated. Thus, diffusion capacity can be reduced without impairing the function as the protection element. Therefore, terminal capacity of the signal terminal can be reduced. In addition, by ensuring a wiring width, the number of contacts, and the number of via holes to the extent that a surge current can flow, ESD resistance can be prevented from being reduced.

Figure 9A:
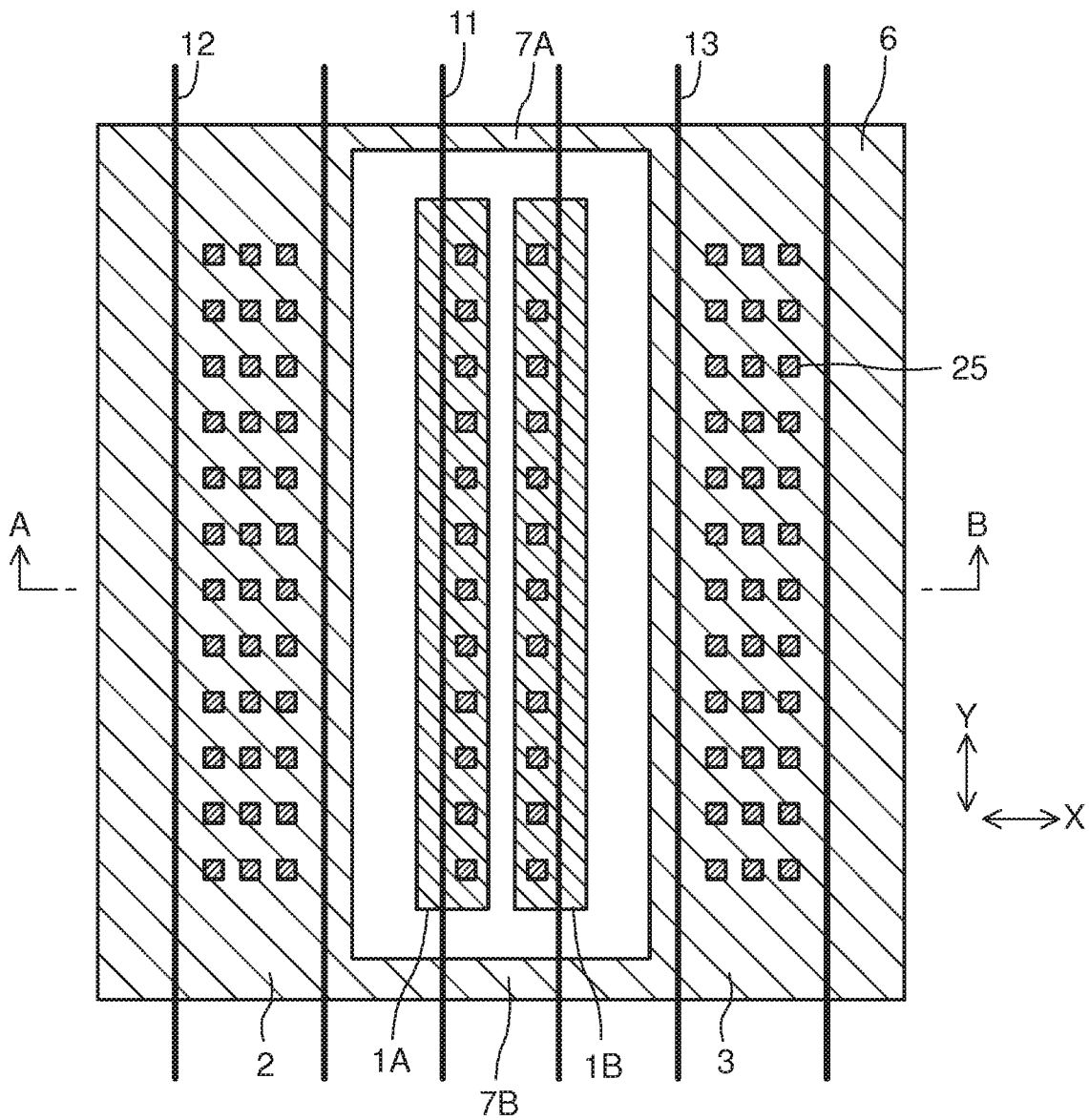
FIG. 9A is a view showing a layout configuration according to a variation of the second exemplary embodiment.
Figure 9B:
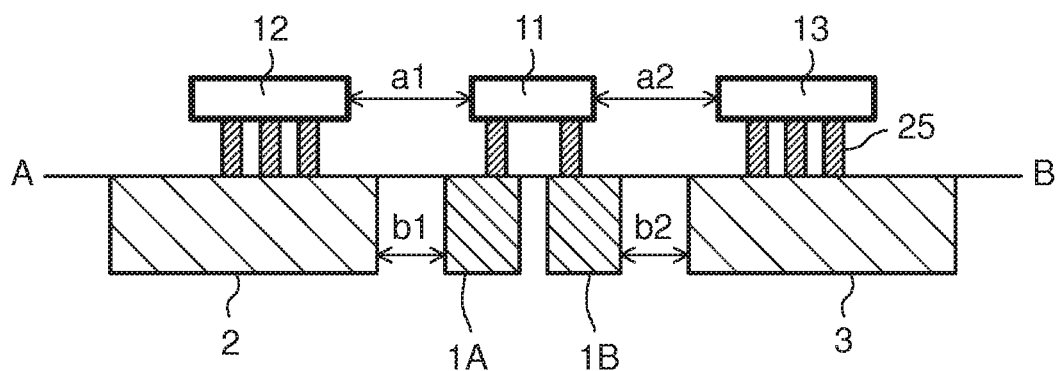
FIG. 9B is a view showing the layout configuration according to the variation of the second exemplary embodiment.

FIGS. 9A and 9B are views showing a variation of this exemplary embodiment. FIG. 9A is a plan view taken from above a substrate, and FIG. 9B is a cross-sectional view taken along a line A-B in FIG. 9A. In FIG. 9, a component common to that in FIG. 8 is marked with the same reference sign.

A configuration of FIG. 9 is almost the same as that in FIG. 8. However, there is a difference between them in that in a range including the diffusion regions opposed to each other, an interval between wirings is larger than an interval between diffusion regions. Therefore, compared with the configuration in FIG. 8, capacity between wirings is also reduced, and terminal capacity can be further reduced.

More specifically, in a range including diffusion region 1A and diffusion region 2 opposed to each other, interval a1 between first wiring 11 and second wiring 12 is larger than interval b1 between diffusion region 1A and diffusion region 2. According to a layout in FIG. 9, diffusion region 1A protrudes toward a side of diffusion region 2 from first wiring 11, and diffusion region 2 protrudes toward a side of diffusion region 1A from second wiring 12, in planar view. Similarly, in a range including diffusion region 1B and diffusion region 3 opposed to each other, interval a2 between first wiring 11 and third wiring 13 is larger than interval b2 between diffusion region 1B and diffusion region 3. According to the layout in FIG. 9, diffusion region 1B protrudes toward a side of diffusion region 3 from first wiring 11, and diffusion region 3 protrudes toward diffusion region 1B from third wiring 13, in planar view.

According to this configuration, the interval between first wiring 11 and second wiring 12, and the interval between first wiring 11 and third wiring 13 are large, so that the capacity between the wirings can be reduced, and terminal capacity can be further reduced.

Figure 10A:
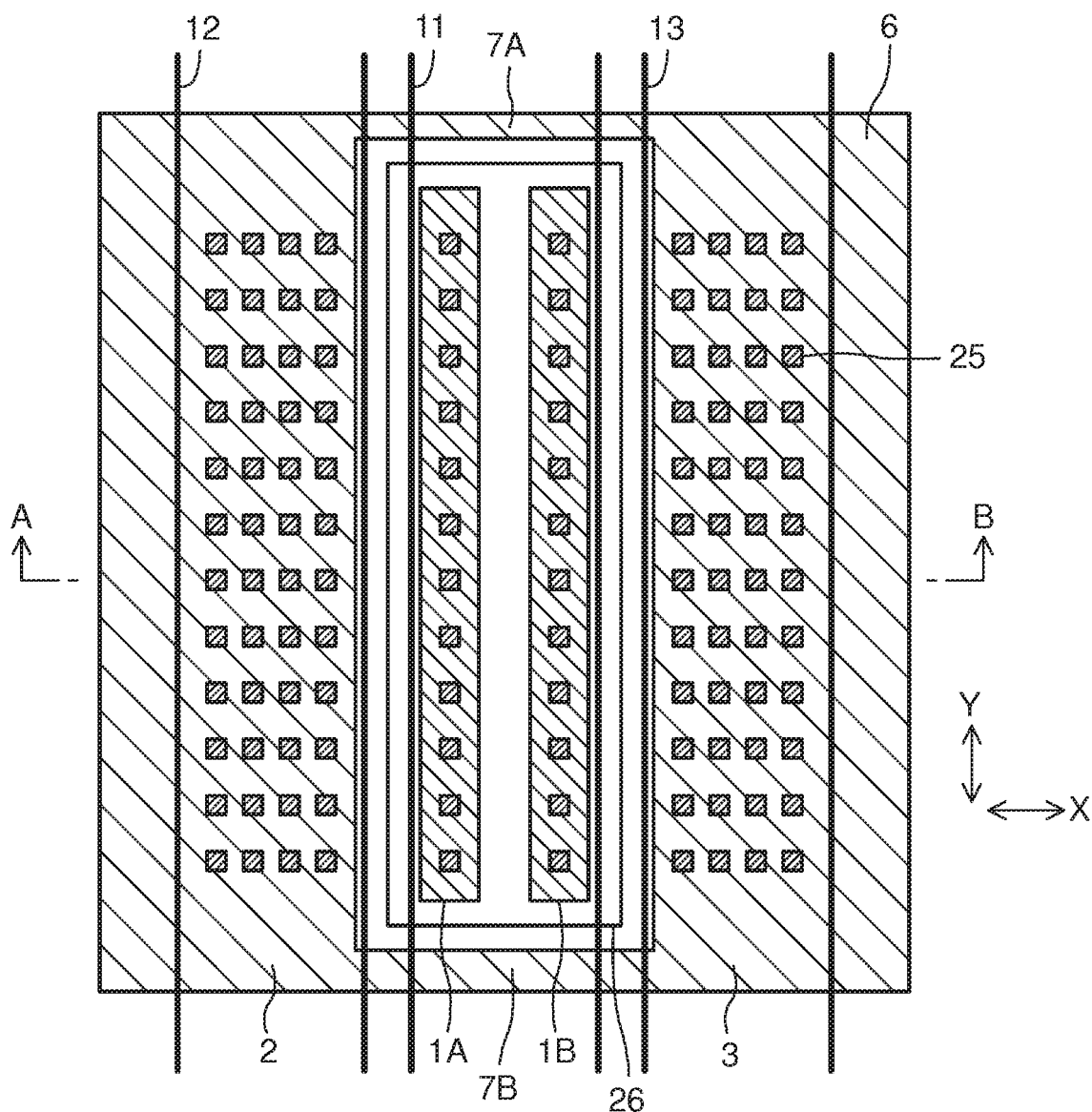
FIG. 10A is a view showing a layout configuration in a case where the ESD protection circuit is a thyristor type in FIG. 8.
Figure 10B:
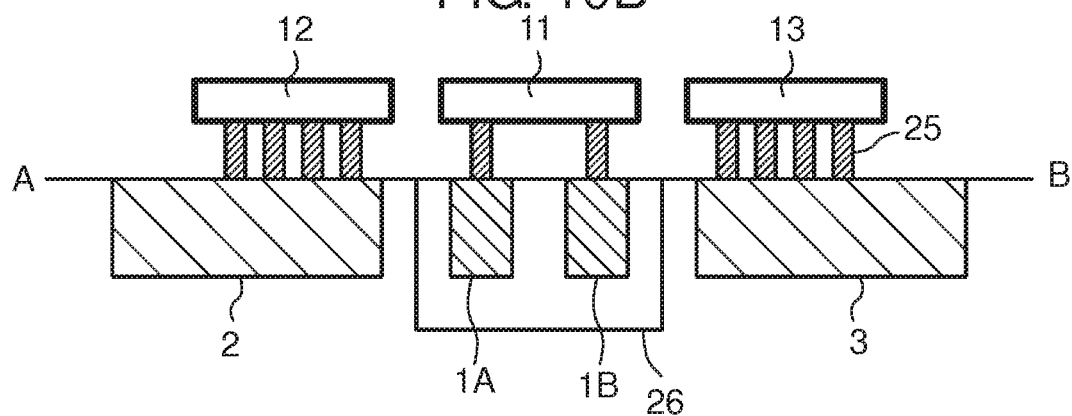
FIG. 10B is a view showing the layout configuration in the case where the ESD protection circuit is the thyristor type in FIG. 8.

In addition, similar to the first exemplary embodiment, the configuration in this exemplary embodiment may be applied to a case where the ESD protection circuit is a diode type, a bipolar transistor type, and a thyristor type. Furthermore, second and third wirings 12 and 13 may be electrically connected to a power supply terminal, or may be electrically connected to a ground terminal. FIGS. 10A and 10B show a layout configuration in which the ESD protection circuit is a thyristor type, in which well 26 is formed around diffusion regions 1A and 1B.

Figure 11A:
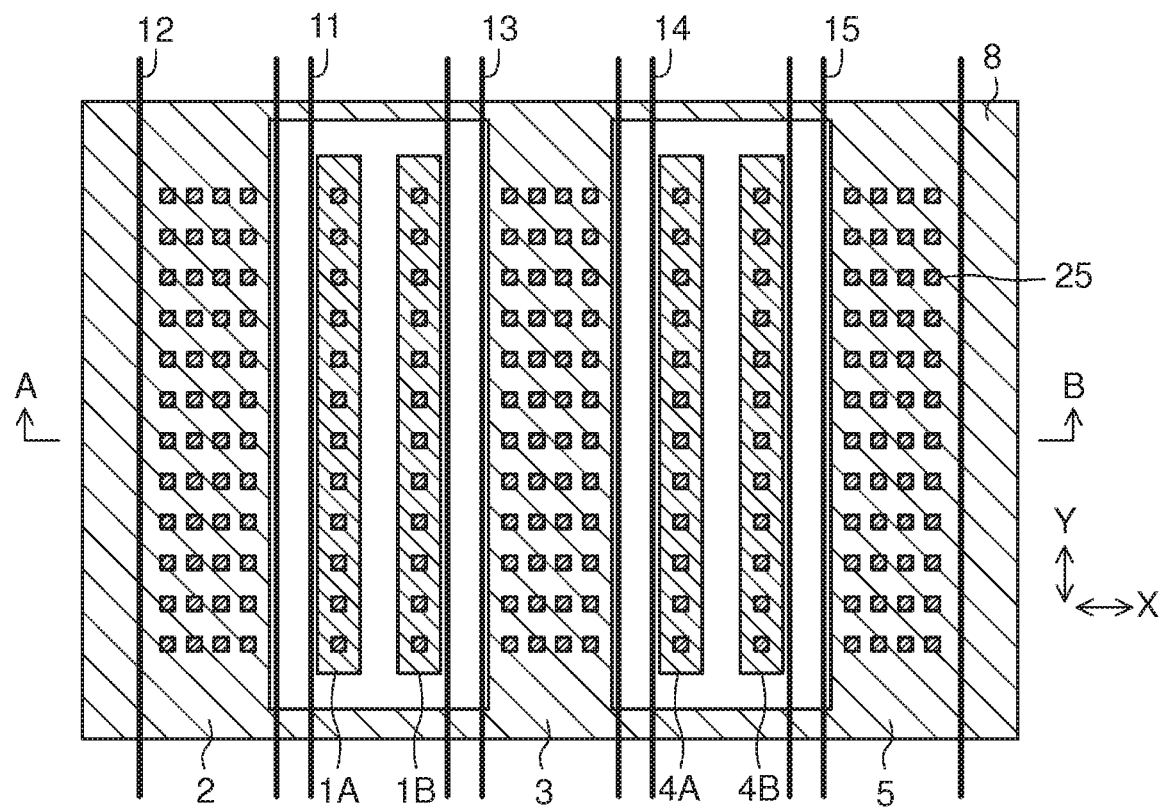
FIG. 11A is a view showing another example of the layout configuration according to the second exemplary embodiment.
Figure 11B:
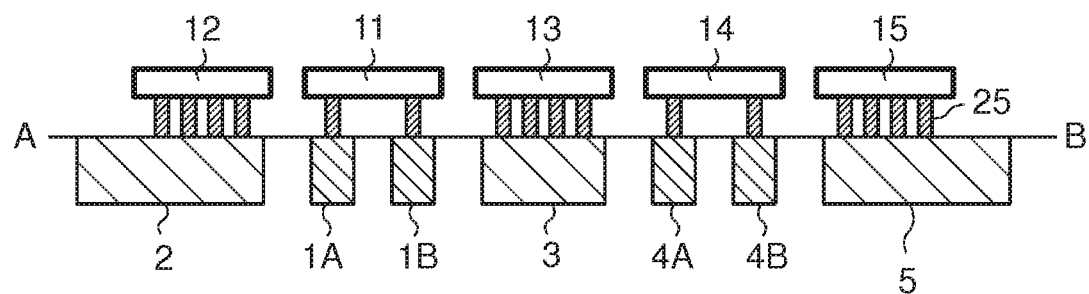
FIG. 11B is a view showing the other example of the layout configuration according to the second exemplary embodiment.

In addition, as shown in FIGS. 11A and 11B, a configuration may be such that the number of the parts in which the diffusion regions are divided is further increased. The configuration in FIG. 11 corresponds to the configuration in FIG. 8. Wiring 14 is electrically connected to a signal terminal, and wiring 15 is electrically connected to a power supply terminal or a ground terminal. Under wiring 14, diffusion regions 4A and 4B are formed so as to be arranged separately in the X direction. In addition, diffusion region 5 is formed under wiring 15.

In addition, according to the above-described layout configuration, diffusion regions 1A and 1B are separated in a whole part of the range in the Y direction, but the configuration is not limited to this, and a layout configuration may be such that diffusion regions 1A and 1B are partially connected and one part of them is separated. In this configuration also, diffusion capacity can be reduced without impairing the function as the protection element, so that terminal capacity of the signal terminal can be reduced. That is, diffusion regions 1A and 1B may be separated in the whole part or one part of the range in the Y direction.

Third Exemplary Embodiment

A third exemplary embodiment shows a configuration in which a diffusion region formed under a wiring connected to a signal terminal is not separated, and an interval between the wirings is larger than an interval between the diffusion regions.

Figure 12A:
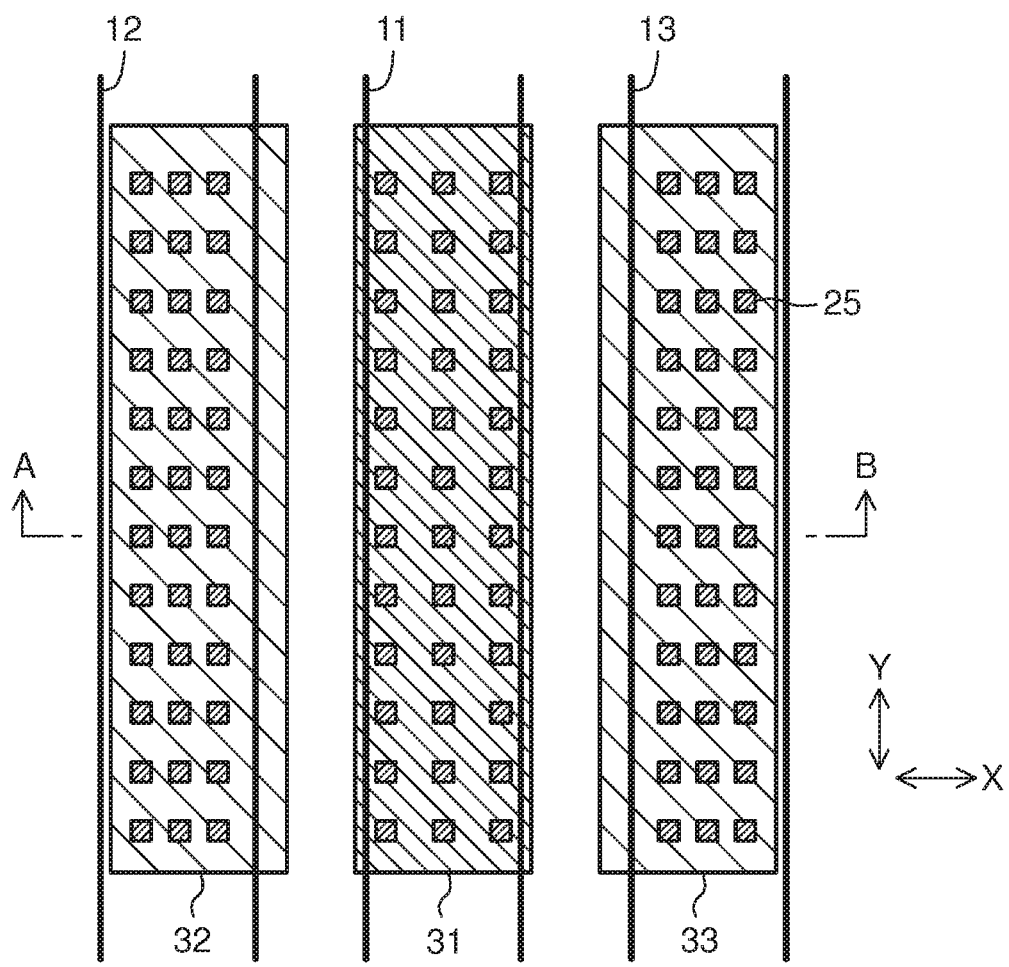
FIG. 12A is a view showing a layout configuration regarding an ESD protection circuit of a semiconductor integrated circuit device according to a third exemplary embodiment.
Figure 12B:
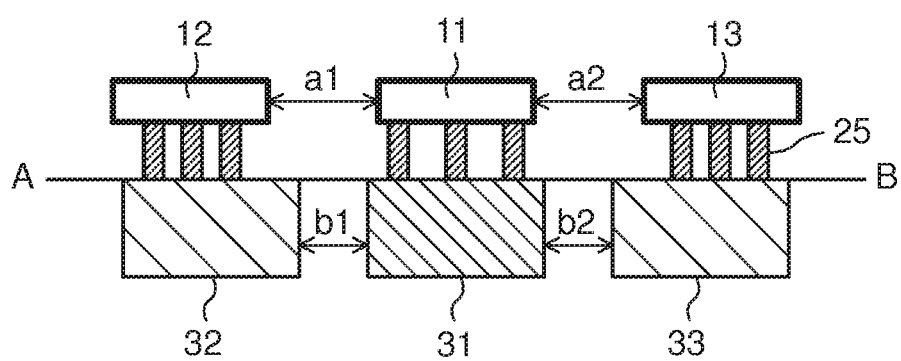
FIG. 12B is a view showing the layout configuration regarding the ESD protection circuit of the semiconductor integrated circuit device according to the third exemplary embodiment.

FIGS. 12A and 12B are views showing a layout configuration regarding an ESD protection circuit of a semiconductor integrated circuit device according to the third exemplary embodiment. FIG. 12A is a plan view taken from above a substrate, and FIG. 12B is a cross-sectional view taken along a line A-B in FIG. 12A.

First wiring 11 extends in a Y direction (first direction) in FIG. 12A, and electrically connected to a signal terminal which is not shown. Second wiring 12 and third wiring 13 extend in the Y direction similarly to first wiring 11, and arranged on both sides of first wiring 11, respectively. Second wiring 12 and third wiring 13 are electrically connected to a power supply terminal or a ground terminal which is not shown.

Under first wiring 11, diffusion region 31 is formed as a first diffusion region. Under second wiring 12, diffusion region 32 is formed as a second diffusion region. Diffusion region 32 is arranged so as to be opposed to diffusion region 31 in the X direction. In addition, under third wiring 13, diffusion region 33 is formed as a third diffusion region. Diffusion region 33 is arranged so as to be opposed to diffusion region 31 in the X direction. Diffusion regions 32 and 33 have the same conductivity type.

First wiring 11 and diffusion region 31 are electrically connected through contacts 25. Similarly, second wiring 12 and diffusion region 32 are electrically connected through contacts 25, and third wiring 13 and diffusion region 33 are electrically connected through contacts 25.

Thus, in a range including diffusion region 31 and diffusion region 32 opposed to each other, interval a1 between first wiring 11 and second wiring 12 is larger than interval b1 between diffusion region 31 and diffusion region 32. According to a layout in FIG. 12, diffusion region 31 protrudes toward a side of diffusion region 32 from first wiring 11, and diffusion region 32 protrudes toward a side of diffusion region 31 from second wiring 12, in planar view. Similarly, in a range including diffusion region 31 and diffusion region 33 opposed to each other, interval a2 between first wiring 11 and third wiring 13 is larger than interval b2 between diffusion region 31 and diffusion region 33. According to the layout in FIG. 12, diffusion region 31 protrudes toward a side of diffusion region 33 from first wiring 11, and diffusion region 33 protrudes toward a side of diffusion region 31 from third wiring 13, in planar view.

According to this configuration, the interval between first wiring 11 and second wiring 12, and the interval between first wiring 11 and third wiring 13 are large, so that capacity between the wirings can be reduced, and terminal capacity regarding the signal terminal can be reduced.

Figure 13A:
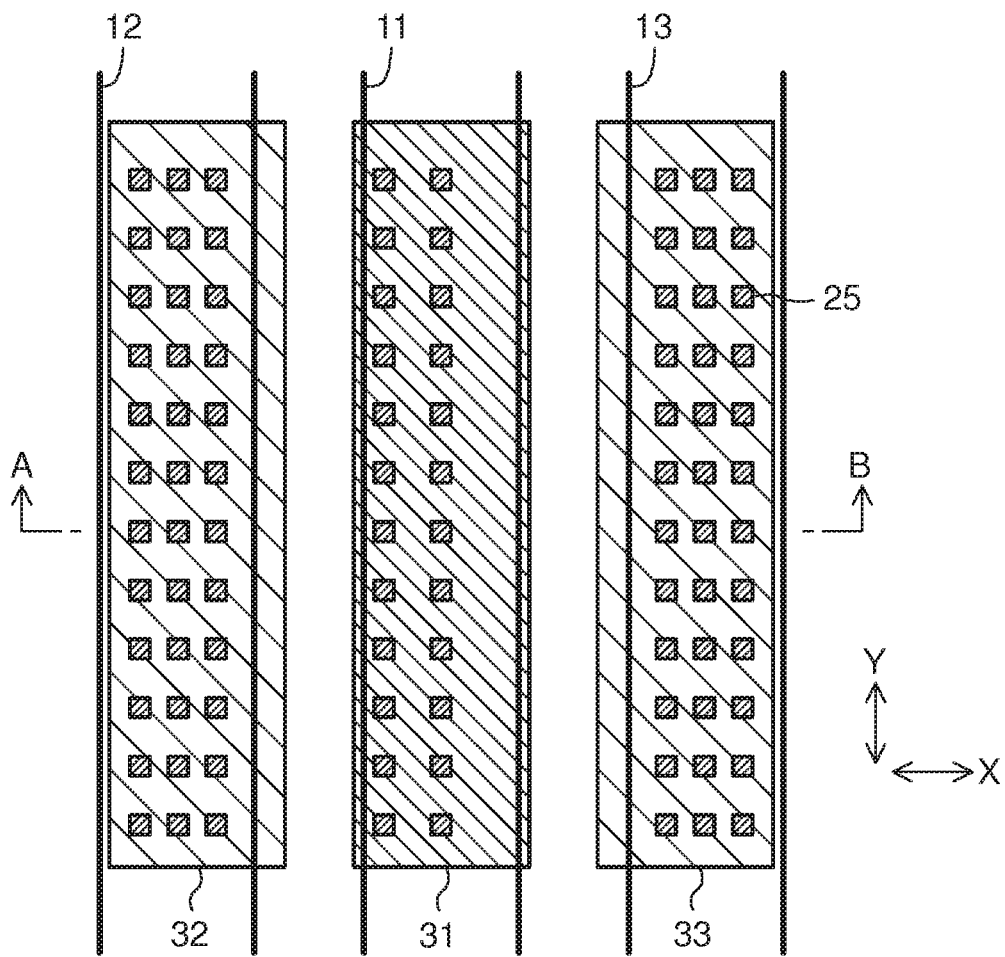
FIG. 13A is a view showing another example of the layout configuration according to the third exemplary embodiment.
Figure 13B:
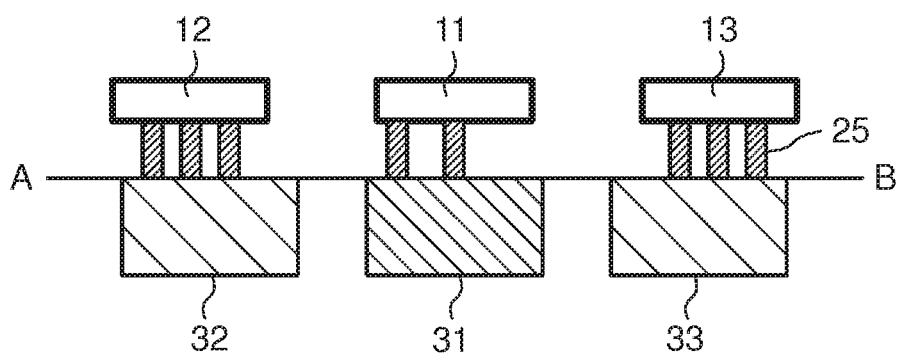
FIG. 13B is a view showing the other example of the layout configuration according to the third exemplary embodiment.

FIGS. 13A and 13B are views showing a variation of this exemplary embodiment. FIG. 13A is a plan view taken from above a substrate, and FIG. 13B is a cross-sectional view taken along a line A-B in FIG. 13A. In FIG. 13, a component common to that in FIG. 12 is marked with the same reference sign.

A configuration in FIG. 13 is almost the same as that in FIG. 12. However, there is a difference between them in which as for a connection between first wiring 11 and diffusion region 31, contacts 25 for one line on a side of third wiring 13 are eliminated. As shown in FIG. 13, by eliminating contacts 25 to the extent that discharge of a surge current is not prevented, capacity between contacts 25 can be reduced.

Figure 14A:
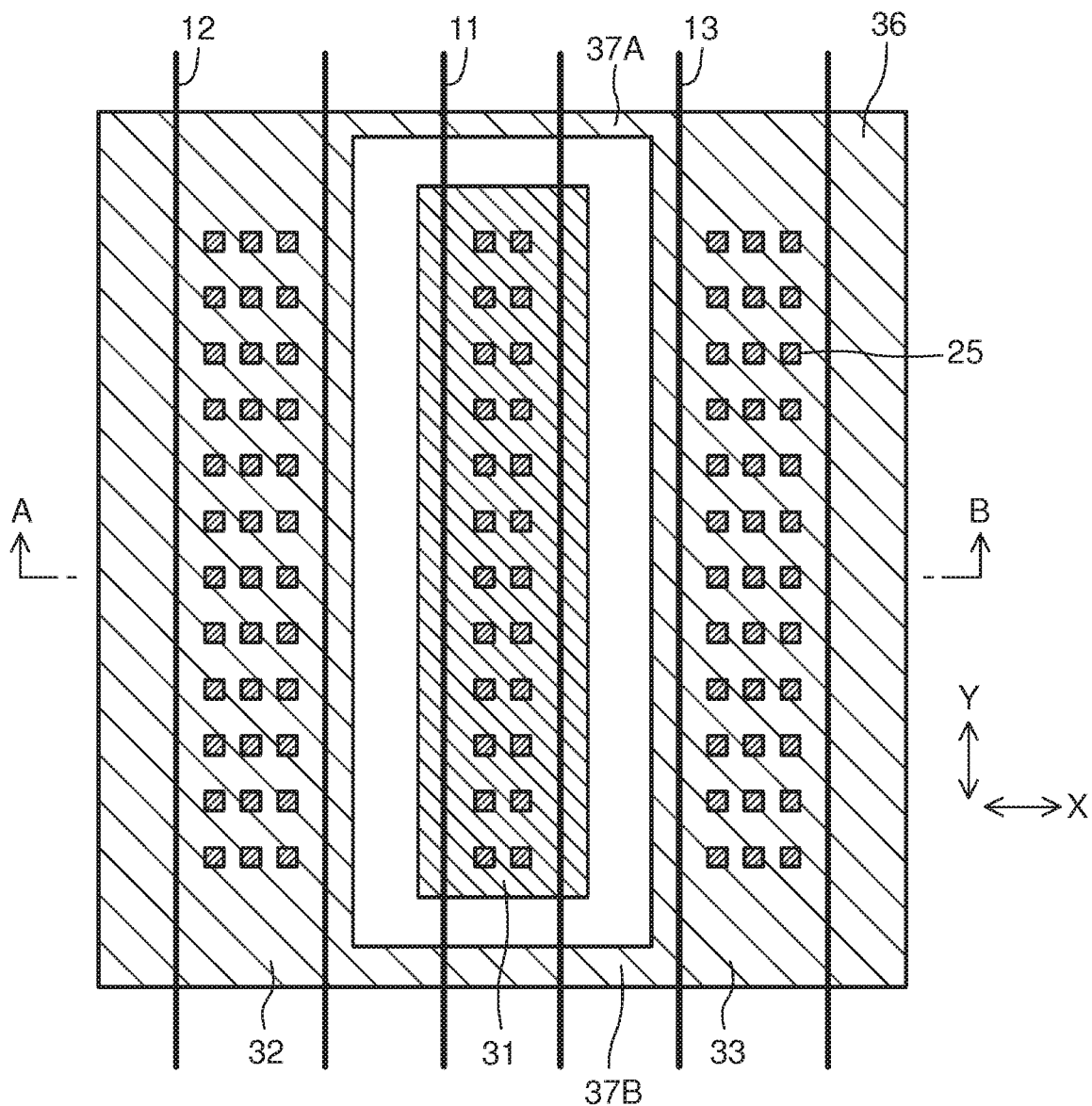
FIG. 14A is a view showing another example of the layout configuration according to the third exemplary embodiment.
Figure 14B:
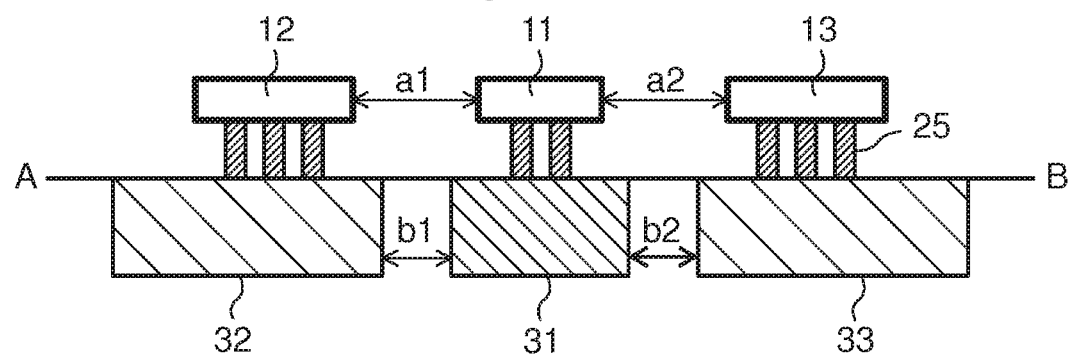
FIG. 14B is a view showing the other example of the layout configuration according to the third exemplary embodiment.
Figure 15:
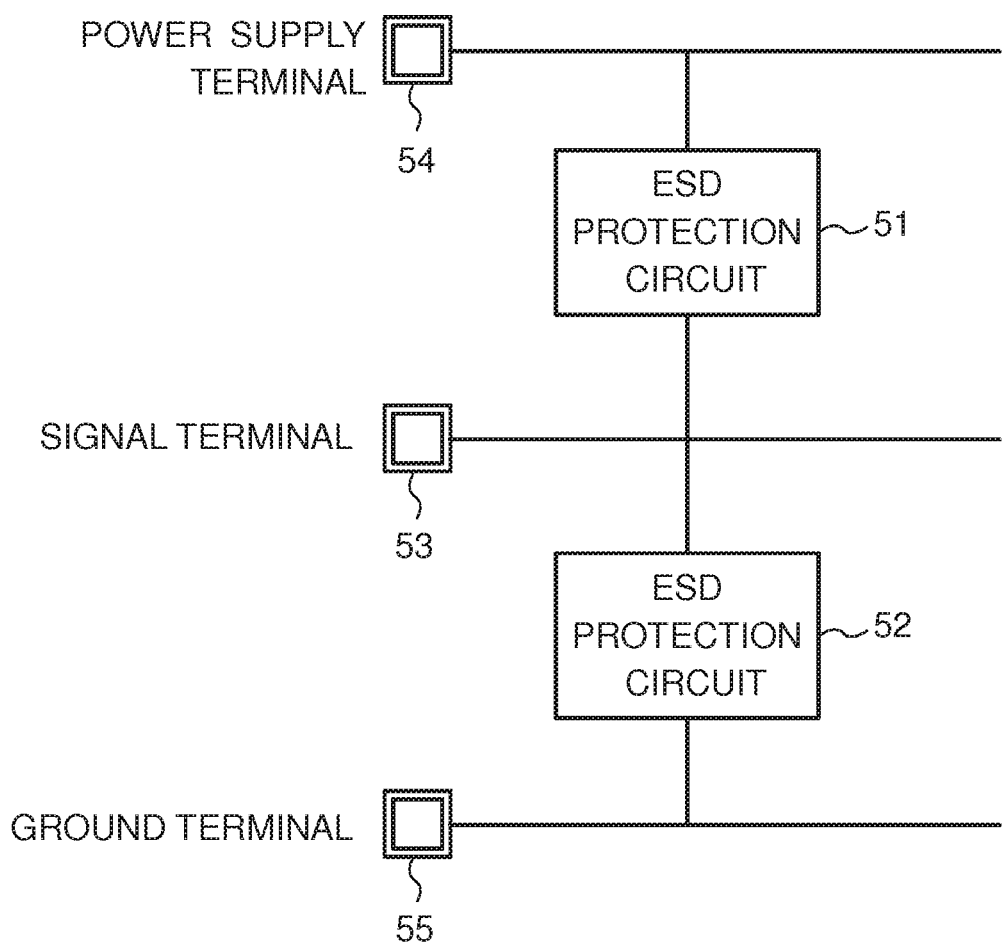
FIG. 15 is a circuit diagram showing a relationship between a signal terminal and the ESD protection circuit.
Figure 16:
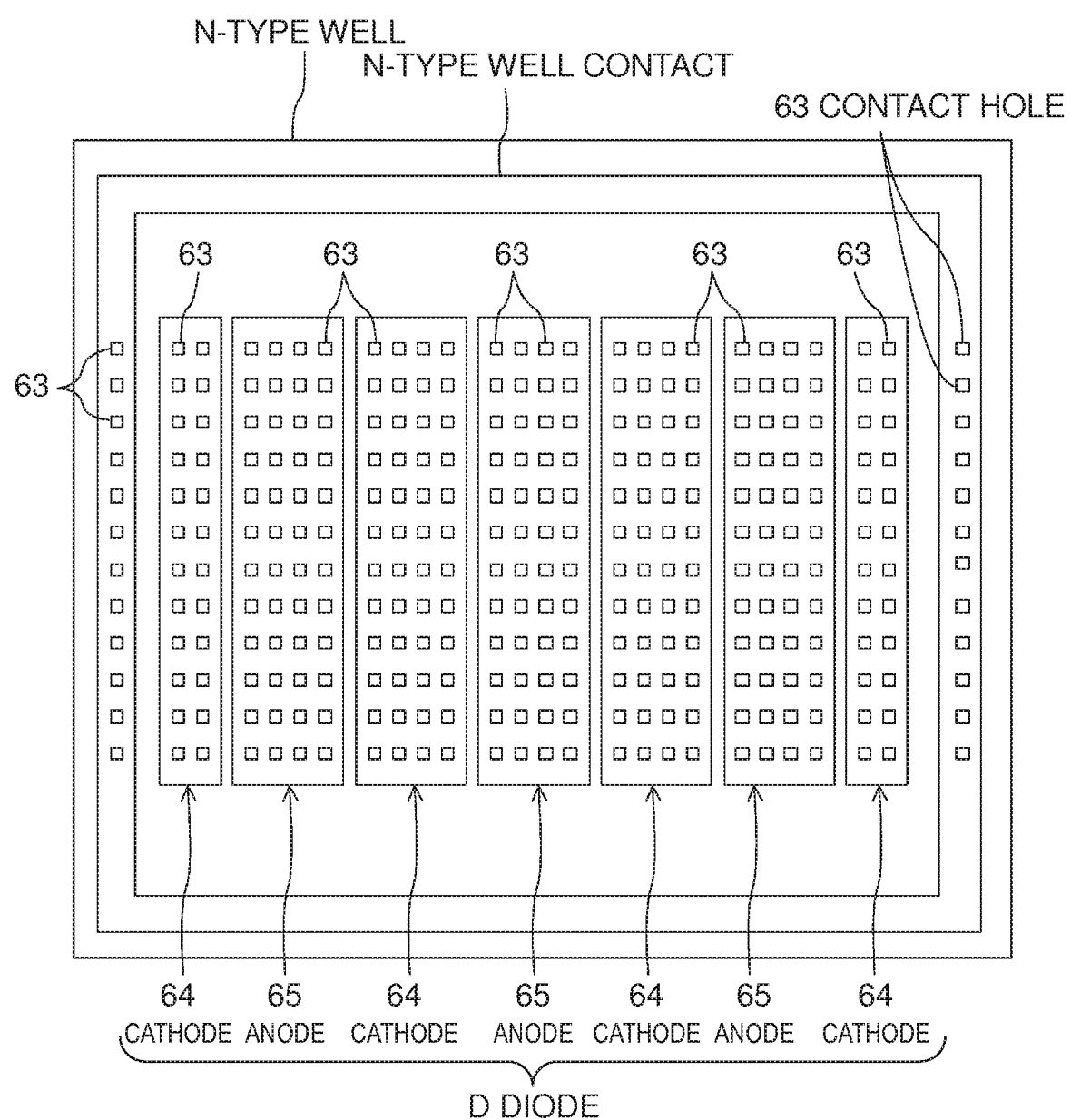
FIG. 16 is a view showing an example of a layout configuration regarding a conventional ESD protection circuit.

FIGS. 14A and 14B are views showing another example of the layout configuration according to this exemplary embodiment. FIG. 14A is a plan view taken from above a substrate, and FIG. 14B is a cross-sectional view taken along a line A-B in FIG. 14A.

First wiring 11 extends in a Y direction (first direction) in FIG. 14A, and electrically connected to a signal terminal which is not shown. Second wiring 12 and third wiring 13 extend in the Y direction similarly to first wiring 11, and arranged on both sides of first wiring 11, respectively. Second wiring 12 and third wiring 13 are electrically connected to a power supply terminal or a ground terminal which is not shown.

Under first wiring 11, diffusion region 31 is formed. Thus, diffusion region 36 is formed so as to surround diffusion region 31. Diffusion region 36 has a shape including diffusion region 32 formed under second wiring 12 and arranged so as to be opposed to diffusion region 31 in an X direction, and diffusion region 33 formed under third wiring 13, and arranged so as to be opposed to diffusion region 31 in the X direction. That is, diffusion regions 32 and 33 are connected to each other through diffusion regions 37A and 37B formed beyond both ends of diffusion region 31 in the Y direction, and integrally formed so as to surround diffusion region 31.

First wiring 11 and diffusion region 31 are electrically connected through contacts 25. Similarly, second wiring 12 and diffusion region 32 are electrically connected through contacts 25, and third wiring 13 and diffusion region 33 are electrically connected through contacts 25.

Thus, in a range including diffusion region 31 and diffusion region 32 opposed to each other, interval a1 between first wiring 11 and second wiring 12 is larger than interval b1 between diffusion region 31 and diffusion region 32. According to a layout in FIG. 14, diffusion region 31 protrudes toward a side of diffusion region 32 from first wiring 11, and diffusion region 32 protrudes toward a side of diffusion region 31 from second wiring 12, in planar view. Similarly, in a range including diffusion region 31 and diffusion region 33 opposed to each other, interval a2 between first wiring 11 and third wiring 13 is larger than interval b2 between diffusion region 31 and diffusion region 33. According to the layout in FIG. 14, diffusion region 31 protrudes toward a side of diffusion region 33 from first wiring 11, and diffusion region 33 protrudes toward a side of diffusion region 31 from third wiring 13, in planar view.

According to this configuration, the interval between first wiring 11 and second wiring 12, and the interval between first wiring 11 and third wiring 13 are large, so that capacity between the wirings can be reduced, and terminal capacity can be reduced.

In addition, similar to the first and second exemplary embodiments, the configuration of this exemplary embodiment may be applied to the case where the ESD protection circuit is a diode type, a bipolar transistor type, and a thyristor type. Furthermore, second and third wirings 12 and 13 may be electrically connected to the power supply terminal, or may be electrically connected to the ground terminal.

As for the semiconductor integrated circuit device according to the present disclosure, the ESD protection circuit can sufficiently fulfill the ability as the protection element while the terminal capacity of the signal terminal is kept small, so that it is effective in improving a signal waveform in an LSI in which a high-speed signal is inputted and outputted, for example.

What is claimed is:

1. A semiconductor integrated circuit device having an ESD (Electro Static Discharge) protection circuit, wherein:
   the ESD protection circuit comprises:
      a first wiring electrically connected to a first terminal;
      a second wiring and a third wiring electrically connected to a power supply terminal or a ground terminal;
      a first region and a second region having a first conductivity type, that are connected to the first wiring, the first and second regions being separated from each other and serving as one of an anode or a cathode of a diode;
      a third region having a second conductivity type different from the first conductivity type, that is connected to the second wiring and disposed so as to be opposed to the first region in a first direction;
      a fourth region having the second conductivity type, that is connected to the third wiring and disposed so as to be opposed to the second region in the first direction, and the third and fourth regions serving as the other of an anode or a cathode of the diode; and
      a fifth region having the second conductivity type,
   the third region, the first region, the second region and the fourth region are disposed in this order in the first direction, and
   the fifth region is disposed so as to be opposed to the first region in a second direction perpendicular to the first direction.

2. The semiconductor integrated circuit device according to claim 1, wherein:
   the first, second and third wirings extend in the second direction.

3. The semiconductor integrated circuit device according to claim 2, wherein:
   a space between the first wiring and the second wiring in the first direction is smaller than a space between the first region and the third region in the first direction, and
   a space between the first wiring and the third wiring in the first direction is smaller than a space between the second region and the fourth region in the first direction.

4. The semiconductor integrated circuit device according to claim 2, wherein:
   a space between the first wiring and the second wiring in the first direction is larger than a space between the first region and the third region in the first direction, and
   a space between the first wiring and the third wiring in the first direction is larger than a space between the second region and the fourth region in the first direction.

5. The semiconductor integrated circuit device according to claim 1, wherein:
   the ESD protection circuit further comprises a sixth region having the second conductivity type, and
   the sixth region is disposed so as to be opposed to the second region in the second direction.

6. The semiconductor integrated circuit device according to claim 1, wherein:
   the ESD protection circuit further comprises a seventh region having the second conductivity type,
   the seventh region is disposed so as to be opposed to the first region in the second direction, and
   the fifth region, the first region and the seventh region are disposed in this order in the second direction.

7. The semiconductor integrated circuit device according to claim 1, wherein:
   a length of each of the first and second regions in the first direction is smaller than a length of each of the first and second regions in the second direction.

8. The semiconductor integrated circuit device according to claim 1, wherein:
   the first conductivity type is a P type and the second conductivity type is an N type, and
   the first and second regions serve as an anode of the diode, and
   the third and fourth regions serve as a cathode of the diode.

9. The semiconductor integrated circuit device according to claim 8, wherein:
   the second and third wirings are electrically connected to the power supply terminal.

10. The semiconductor integrated circuit device according to claim 1, wherein:
    the first conductivity type is an N type and the second conductivity type is a P type,
    the first and second regions serve as a cathode of the diode, and
    the third and fourth regions serve as an anode of the diode.

11. The semiconductor integrated circuit device according to claim 10, wherein:
    the second and third wirings are electrically connected to the ground terminal.

12. A semiconductor integrated circuit device having an ESD (Electro Static Discharge) protection circuit, wherein:
    the ESD protection circuit comprises:
       a first wiring and a second wiring electrically connected to a first terminal;

a third wiring, a fourth wiring and a fifth wiring electrically connected to a power supply terminal or a ground terminal;

a first region and a second region having a first conductivity type, that are connected to the first wiring, the first and second regions being separated from each other;

a third region and a fourth region having the first conductivity type, that are connected to the second wiring, the third and fourth regions being separated from each other, and the first, second, third and fourth regions serving as one of an anode or a cathode of a diode;

a fifth region having a second conductivity type different from the first conductivity type, that is connected to the third wiring and disposed so as to be opposed to the first region in a first direction;

a sixth region having the second conductivity type, that is connected to the fourth wiring and disposed so as to be opposed to the second region in the first direction;

a seventh region having the second conductivity type, that is connected to the fifth wiring and disposed so as to be opposed to the fourth region in the first direction, and the fifth, the sixth and the seventh regions serving as the other of an anode or a cathode of the diode; and an eighth region and a ninth region having the second conductivity type, the fifth region, the first region, the second region, the sixth region, the third region, the fourth region and the seventh region are disposed in this order in the first direction, the eighth region is disposed so as to be opposed to the first region in a second direction perpendicular to the first direction, and the ninth region is disposed so as to be opposed to the third region in the second direction.

13. The semiconductor integrated circuit device according to claim 12, wherein:

the first, second, third, fourth and fifth wirings extend in the second direction.

14. The semiconductor integrated circuit device according to claim 13, wherein:

a space between the first wiring and the third wiring in the first direction is smaller than a space between the first region and the fifth region in the first direction, a space between the first wiring and the fourth wiring in the first direction is smaller than a space between the second region and the sixth region in the first direction, a space between the second wiring and the fourth wiring in the first direction is smaller than a space between the third region and the sixth region in the first direction, and a space between the second wiring and the fifth wiring in the first direction is smaller than a space between the fourth region and the seventh region in the first direction.

15. The semiconductor integrated circuit device according to claim 12, wherein:

the ESD protection circuit further comprises a tenth region and an eleventh region having the second conductivity type, the tenth region is disposed so as to be opposed to the second region in the second direction, and the eleventh region is disposed so as to be opposed to the fourth region in the second direction.

16. The semiconductor integrated circuit device according to claim 12, wherein:

the ESD protection circuit further comprises a twelfth region and a thirteenth region having the second conductivity type, the twelfth region is disposed so as to be opposed to the first region in the second direction, the thirteenth region is disposed so as to be opposed to the third region in the second direction, the eighth region, the first region and the twelfth region are disposed in this order in the second direction, and the ninth region, the third region and the thirteenth region are disposed in this order in the second direction.

17. The semiconductor integrated circuit device according to claim 12, wherein:

a length of each of the first, second, third and fourth regions in the first direction is smaller than a length of each of the first, second, third and fourth regions in the second direction.

18. The semiconductor integrated circuit device according to claim 12, wherein:

the first conductivity type is a P type and the second conductivity type is an N type, the first, second, third and fourth regions serve as an anode of the diode, the fifth, sixth and seventh regions serve as a cathode of the diode, and the third, fourth and fifth wirings are electrically connected to the power supply terminal.

19. The semiconductor integrated circuit device according to claim 12, wherein:

the first conductivity type is an N type and the second conductivity type is a P type, the first, second, third and fourth regions serve as a cathode of the diode, the fifth, sixth and seventh regions serve as an anode of the diode, and the third, fourth and fifth wirings are electrically connected to the ground terminal.

* * * * *